(12) United States Patent
Waters

(10) Patent No.: US 7,767,483 B1
(45) Date of Patent: Aug. 3, 2010

(54) DUAL-SUSPENSION SYSTEM FOR MEMS-BASED DEVICES AND METHOD FOR FABRICATING SAME

(75) Inventor: Richard L. Waters, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 398 days.

(21) Appl. No.: 11/780,420

(22) Filed: Jul. 19, 2007

Related U.S. Application Data

(60) Provisional application No. 60/835,965, filed on Jul. 25, 2006.

(51) Int. Cl.
*H01L 21/00* (2006.01)

(52) U.S. Cl. .................. 438/51; 257/E29.234
(58) Field of Classification Search .............. 438/51, 438/50, 52, 53; 257/E29.234
See application file for complete search history.

(56) References Cited

U.S. PATENT DOCUMENTS

| | | | |
|---|---|---|---|
| 6,555,404 B1 * | 4/2003 | Kubena et al. ............... | 438/22 |
| 6,936,492 B2 * | 8/2005 | McNeil et al. ............... | 438/50 |
| 2003/0116815 A1 * | 6/2003 | Dewa ......................... | 257/432 |
| 2004/0147056 A1 * | 7/2004 | McKinnell et al. .......... | 438/52 |

* cited by examiner

*Primary Examiner*—Bradley K Smith
*Assistant Examiner*—Amar Movva
(74) *Attorney, Agent, or Firm*—Ryan J. Friedl; Kyle Eppele

(57) ABSTRACT

A method for fabricating a dual-suspension system for MEMS-based devices includes: etching the geometry of an upper spring system, a lower spring system, and a proof mass into a substrate; applying a protective barrier to cover at least the exposed portions of the first layer of silicon; etching through portions of the protective barrier and handle wafer to define the shapes of the upper spring system, lower spring system, and proof mass; removing the remainder of the protective barrier; and removing the first layer of oxide from the areas in contact with the upper spring system and removing the second layer of oxide from the areas in contact with the lower spring system. Electrical contacts may be created on the substrate. A wafer may be bonded to the support structure on a side of the substrate. A MEMS-based device fabricated from the method is also provided.

32 Claims, 20 Drawing Sheets

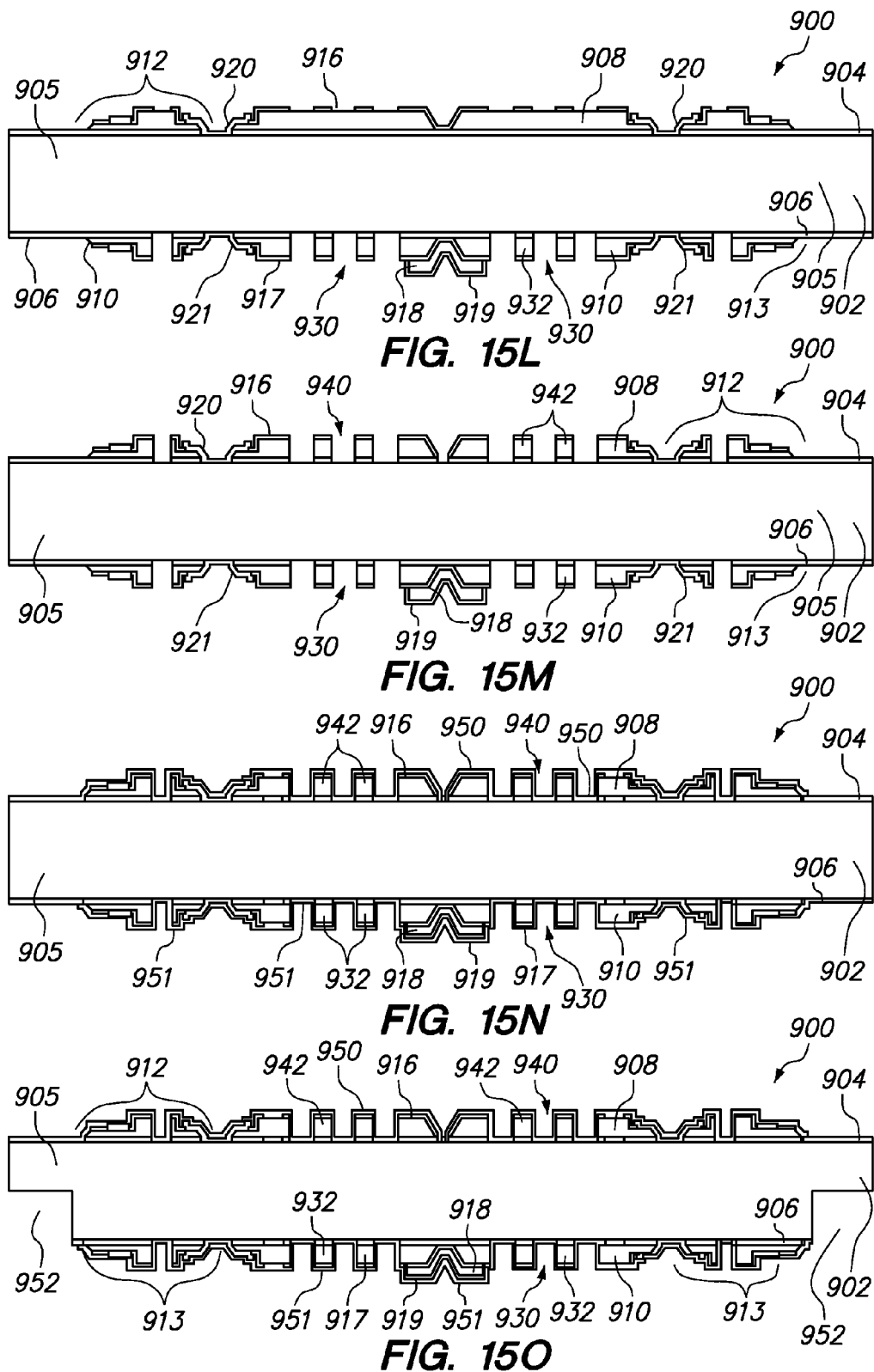

US 7,767,483 B1

DUAL-SUSPENSION SYSTEM FOR MEMS-BASED DEVICES AND METHOD FOR FABRICATING SAME

CROSS-REFERENCE TO RELATED APPLICATIONS

This application claims the benefit of U.S. Provisional Patent Application Ser. No. 60/835,965, filed on Jul. 25, 2006, entitled "Dual-Suspension System for MEMS-based Devices", the content of which if fully incorporated by reference herein.

FEDERALLY-SPONSORED RESEARCH OR DEVELOPMENT

The Dual-Suspension System for MEMS-based Devices and Method for Fabricating Same was developed with Federal funds and is assigned to the United States Government. Licensing and technical inquiries may be directed to the Office of Patent Counsel, Space and Naval Warfare Systems Center, San Diego, Code 20012, San Diego, Calif., 92152; telephone (619) 553-3001, facsimile (619) 553-3821. Reference Navy Case No. 96659.

BACKGROUND OF THE INVENTION

The present invention is generally related to the field of micro electro-mechanical machine (MEMS) based devices.

The ability to detect small displacement is at the heart of many MEMS-based sensors, such as accelerometers, gyroscopes, pressure sensors, acoustic sensors, magnetic sensors, and temperature sensors. In many applications, the detection of a small displacement must be very stable and repeatable. The functionality of many MEMS-based devices is predicated on the design of the support structure which directly affects the mechanical properties of the device. For instance, the support structure used in MEMS-based accelerometers and gyroscopes dictates the mechanical displacement, resonant frequency and stability of the device.

One of the primary limitations of many inertial sensors such as accelerometers and gyroscopes is their stability. In order to increase stability, increased symmetry of the mechanical structure is required and/or the mechanical structure itself must be fabricated in such a way as to increase its stability. The design of the support structure also plays a role in the hysteresis and temperature-dependence of the device. For high performance sensors, such as navigation grade accelerometers and gyroscopes, the stability of the mechanical structure as well as temperature dependence become increasingly important parameters. Highly symmetric structures are desirable for their ability to increase stability and reduce temperature dependence. In addition, if the symmetry can include a dual suspension system, the stability can be increased. A method for fabricating a dual suspension system affords designers greater latitude in the choice of design parameters, results in an overall more robust design, and allows the flexibility to fabricate many different structures including comb-drives, parametric oscillators, and stress-relief structures.

Therefore, there is a current need for a dual-suspension system for MEMS-based devices that provides increased symmetry and stability, as well as a method for fabricating MEMS-based devices having such a dual-suspension system.

DETAILED DESCRIPTION OF SOME EMBODIMENTS

Figure 1:
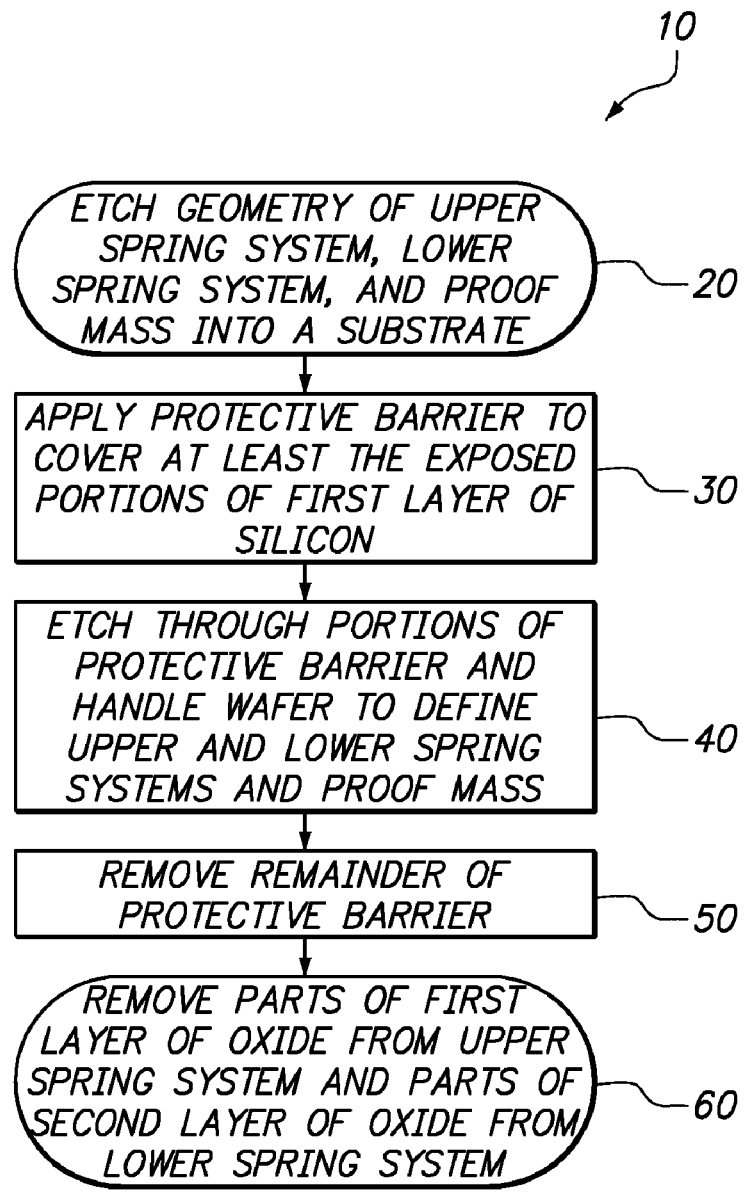
FIG. 1 shows a flowchart of one embodiment of a method for fabricating a dual-suspension system for MEMS-based devices.
Figure 15A:
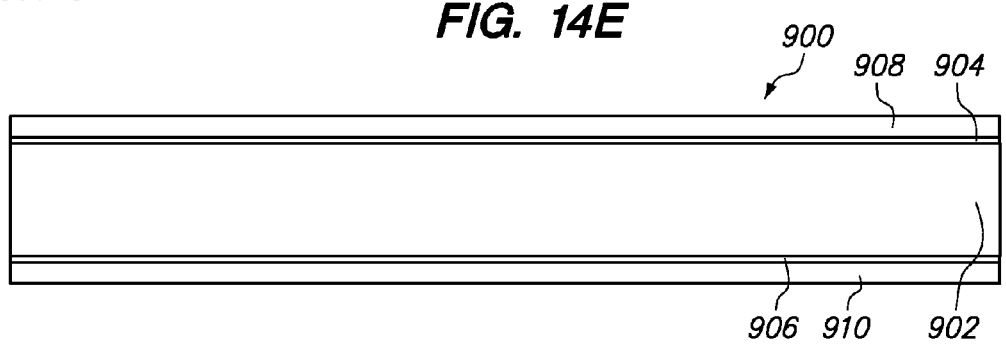
FIGS. 15A-15R show cross-sectional views of specific steps of an embodiment of the fabrication process of a substrate portion having an optical device therein, for inclusion within one embodiment of a MEMS-based device having a dual-suspension system fabricated from an embodiment of a method for fabricating a dual-suspension system for MEMS-based devices.

FIG. 1 shows a flowchart of one embodiment of a method 10 for fabricating a dual-suspension system for MEMS-based devices. For illustrative purposes, and without limitation, method 10 will be discussed with reference to substrate 900 as shown in FIGS. 15A-15R. Method 10 may begin at step 20, where the geometry of an upper spring system 940, a lower spring system 930, and a proof mass 960 are etched into a substrate. Substrate may initially comprise a handle wafer 902 having a first side and a second side, a first layer of oxide 904 covering the first side and a second layer of oxide 906 covering second side, and a first layer of silicon 908 covering first layer of oxide 904 and a second layer of silicon 910 covering second layer of oxide 906. Layers of oxide 904 and 906 may serve as a selective etch stop for both the dry and wet silicon etches and may help to preserve the symmetry of substrate 900. The geometry of upper spring system 940, lower spring system 930, and proof mass 960 may be etched into each of first layer of silicon 908 and second layer of silicon 910. The geometry of upper spring system 940, lower spring system 930, and proof mass 960 may be etched into first layer of silicon 908 and second layer of silicon 910 using either Deep Reactive Ion Etching (DRIE) or other equivalent dry-chemistries, or by wet selective silicon etchants, such as tetramethylammonium hydroxide (TMAH), Potassium hydroxide (KOH) or ethylenediamene pyrocatecol (EDP). An example of the etching of the geometry of lower spring system 930 and part of the geometry of proof mass 960 may be seen between FIGS. 15J and 15K. An example of the etching of the geometry of upper spring system 930 and part of the geometry of proof mass 960 may be seen between FIGS. 15L and 15M.

The regions of substrate 900 opposite proof mass 960 and adjacent to upper spring system 940 and lower spring system 930 may define a support structure 905. Upper spring system 940 and lower spring system 930 may extend from support structure 905 to support proof mass 960. Method 10 may next proceed to step 30, where a protective barrier, such as layer 950, may be applied to cover at least the exposed portions of first layer of silicon 908. In some embodiments, layer 950 may also cover the exposed portions of first layer of oxide 904. Protective barrier 950 may be an oxide or photoresist and may serve as a mask during the subsequent etch through handle wafer 902. Protective barrier 950 may overlap first layer of silicon 908 to ensure protection during the etching process. In some embodiments, another protective barrier, such as layer 951, may be applied to cover any exposed portions of second layer of silicon 910 and/or second layer of oxide 906. An example of the application of protective barriers, such as layers 950 and 951, may be seen between FIGS. 15M and 15N.

Following step 30, step 40 may involve etching through portions of protective barriers 950 and 951, and handle wafer 902 to define the shapes of upper spring system 940, lower spring system 930, and proof mass 960. This step is explained in more detail in FIG. 2. An example of the etching through protective barriers, such as layers 950 and 951, as well as handle wafer 902 may be seen between FIGS. 15O through 15Q. Next, step 50 may involve removing the remainder of the protective barrier. In some embodiments, the remainder of the protective barrier may occur only on one side of substrate 900, while in other embodiments the protective barriers may be removed from both sides of substrate 900. As an example, the removal of protective barriers, such as layers 950, 951, and 916, may be seen between FIGS. 15Q and 15R. Method 10 may then conclude with step 60, where first layer of oxide 904 may be removed from the areas in contact with upper spring system 940 and second layer of oxide 906 may be removed from the areas in contact with lower spring system 930. Step 60 may be performed by use of a wet etchant such as pad etch, buffered oxide etch, or hydrofluoric acid. As an example, the removal of layers of oxide 904 and 906 may be seen between FIGS. 15Q and 15R. In some embodiments, steps 50 and 60 may be combined so as to occur at the same time as part of the same step. In other embodiments, step 60 may be separate from and follow step 50.

Figure 2:
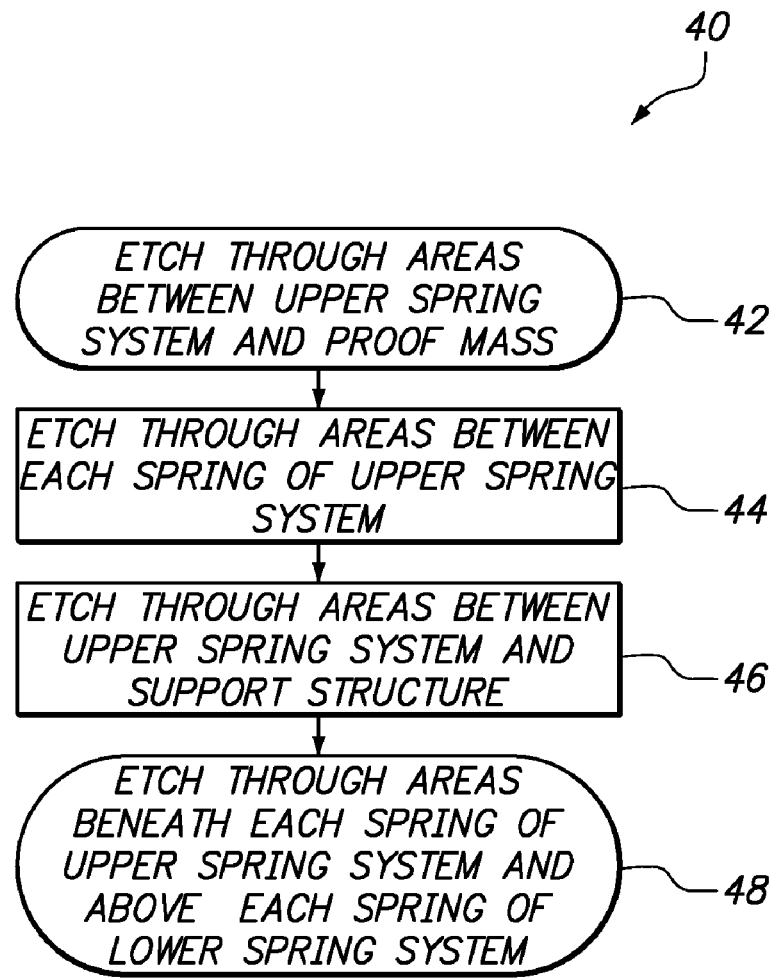
FIG. 2 shows a flowchart of one embodiment of the step of etching through portions of the protective barrier and handle wafer to define the upper spring system, lower spring system, and proof mass, in accordance with one embodiment of a method for fabricating a dual-suspension system for MEMS-based devices.

FIG. 2 shows a flowchart of one embodiment of step 40 of method 10. Step 40 may begin at step 42, where etching occurs through the areas between upper spring system 940 and proof mass 960. Next, step 44 may involve etching through the areas between each spring 942 of upper spring system 940. Step 46 next may involve etching through the areas between upper spring system 940 and support structure 905. In some embodiments, the etching process may end with step 46. In other embodiments, step 40 may conclude at step 48, where etching occurs through the areas beneath each spring 942 of upper spring system 940 and above each spring 932 of lower spring system 930. Step 48 may be performed by use of a quick preferential silicon etchant such as TMAH or KOH. The crystalline orientation of handle wafer 902 should be chosen while considering the geometries of upper spring system 940 and lower spring system 930 so that no silicon etch stop planes exist underneath the upper spring system 940 or lower spring system 930 during the etching. The quick silicon etch may also increase the symmetry of substrate 900 since dry etches, such as those involving DRIE, do not have a perfectly vertical profile. In some embodiments, steps 42, 44, 46, and 48 may occur at the same time, in any order. In other embodiments, steps 42, 44, and 46 may occur at about the same time, then step 48. An example of the etching through protective barriers, such as layers 950 and 951, as well as handle wafer 902 may be seen between FIGS. 15O through 15Q.

Figure 3:
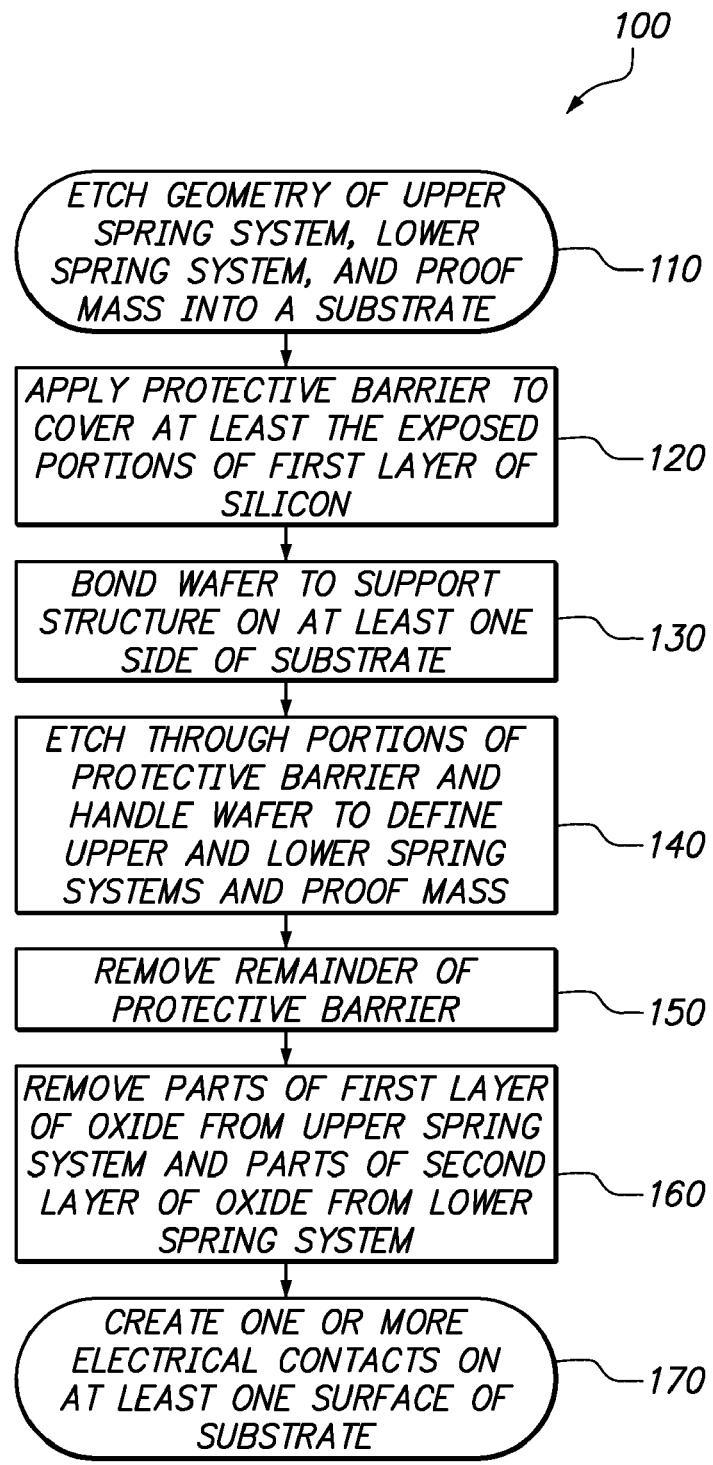
FIG. 3 shows a flowchart of one embodiment of a method for fabricating a dual-suspension system for MEMS-based devices.

FIG. 3 shows a flowchart of one embodiment of a method 100 for fabricating a dual-suspension system for MEMS-based devices. For illustrative purposes, and without limitation, method 100 will be discussed with reference to substrate 900 as shown in FIGS. 15A-15R. Method 100 may begin at step 110, where the geometry of an upper spring system 940, a lower spring system 930, and a proof mass 960 may be etched into substrate 900. Substrate 900 may initially comprise a handle wafer 902 having a first side and a second side, a first layer of oxide 904 covering the first side and a second layer of oxide 906 covering second side, and a first layer of silicon 908 covering the first layer of oxide 904 and a second layer of silicon 910 covering the second layer of oxide 906. The geometry of upper spring system 940, lower spring system 930, and part of proof mass 960 may be etched into each of first layer of silicon 908 and second layer of silicon 910. The regions of substrate 900 opposite proof mass 960 and adjacent to upper spring system 940 and lower spring system 930 may define a support structure 905. An example of the etching of the geometry of lower spring system 930 and part of the geometry of proof mass 960 may be seen between FIGS. 15J and 15K. An example of the etching of the geometry of upper spring system 930 and part of the geometry of proof mass 960 may be seen between FIGS. 15L and 15M.

Method 100 may next proceed to step 120, where a protective barrier, such as layer 950, may be applied to cover at least the exposed portions of first layer of silicon 908. In some embodiments, layer 950 may also cover the exposed portions of first layer of oxide 904. Protective barrier 950 may be an oxide or photoresist and may serve as a mask during the subsequent etching through handle wafer 902. Protective barrier 950 may overlap first layer of silicon 908 to ensure protection during the etching process. In some embodiments, another protective barrier, such as layer 951, may be applied to cover any exposed portions of second layer of silicon 910 and/or second layer of oxide 906. An example of the application of protective barriers, such as layers 950 and 951, may be seen between FIGS. 15M and 15N. Following step 120, step 130 may involve bonding a wafer to support structure 905 on at least one side of substrate 900. Step 130 is explained in more detail with reference to FIG. 4. An example of the bonding of a wafer to a substrate may be seen between FIGS. 17A through 17E, wherein a wafer 1110 is bonded to a substrate 1130. The bonding may occur by glass-fit bonding, eutectic bonding, compression bonding, or any other type of bonding, or combination of types of bonding, as recognized by one having ordinary skill in the art.

Next, step 140 may involve etching through portions of the protective barrier, such as layer 950 and handle wafer 902, to define the shapes of upper spring system 940, lower spring system 930, and proof mass 960. Step 140 may be similar to step 40 described above. Next, step 150 may involve removing the remainder of protective barrier. Step 150 may be similar to step 50 described above. Method 100 may then proceed to step 160, where first layer of oxide 904 is removed from the areas in contact with upper spring system 940 and second layer of oxide 906 is removed from the areas in contact with lower spring system 930. Step 160 may be similar to step 60 described above.

Following step 160, method 100 may conclude at step 170. Step 170 may involve creating one or more electrical contacts on at least one surface of substrate 900. By making electrical contacts, an equal potential can be applied to the entire mechanical structure, increasing overall symmetry when an electrostatic potential is applied between the mechanical structure and either a cap wafer or lower wafer. If the potential applied to the mechanical structure were not symmetric then application of a potential to either a cap wafer, such as cap wafer 1210 in FIG. 18, or a lower wafer, such as wafer 1240 in FIG. 18, may result in an uneven displacement of the proof mass or even a tipping/tilting of the device, which could decrease stability and may increase hysteretic affects. The step of creating electrical contacts is discussed in more detail with respect to FIG. 5. An example of the creation of electrical contacts may be seen between FIGS. 15D through 15I. A detailed view of electrical contacts may be seen in FIG. 9, with reference to electrical contacts 370 and 372.

Figure 4:
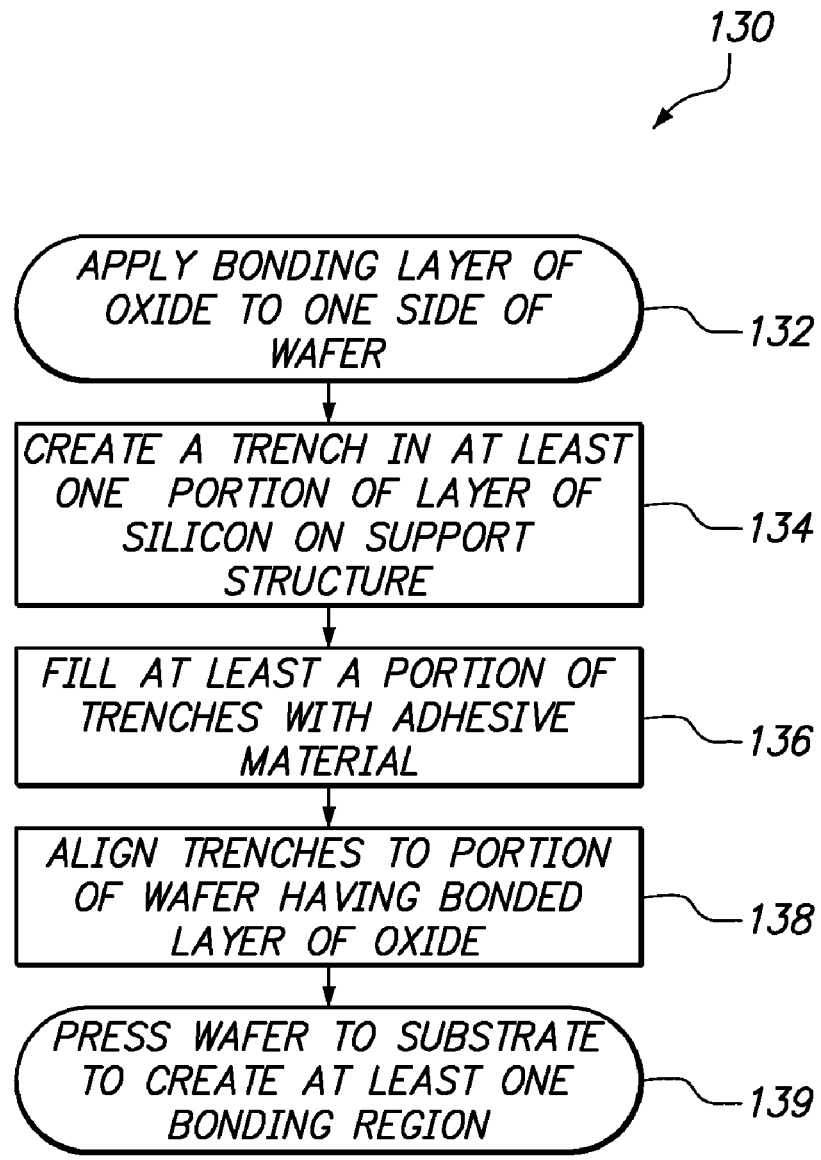
FIG. 4 shows a flowchart of one embodiment of the step of bonding a wafer to the support structure on at least one side of the substrate, in accordance with one embodiment of a method for fabricating a dual-suspension system for MEMS-based devices.

FIG. 4 shows a flowchart of one embodiment of step 130 of method 100. For illustrative purposes, and without limitation, method 100 will be discussed with reference to device 1100 as shown in FIGS. 17A-17E. Step 130 may begin at step 132, where a bonding layer of oxide 1111 may be applied to at least one portion of one side of a wafer 1110. Next, step 134 may involve creating a trench (not shown) in at least one portion of layer of silicon 1131 on support structure 1132. Following step 134, step 130 may proceed to step 136. Step 136 may involve filling at least a portion of trenches with an adhesive material 1150. Adhesive material 1150 may be any material that may be used for bonding wafers, such as glass frit. Next, step 138 may involve aligning the trenches to the portions of wafer 1110 having a bonding layer of oxide 1111. Method 130 may conclude at step 139, where wafer 1110 is pressed to substrate 1130. During step 139, at least one bonding region, such as bonding regions 1160 and 1162, may be formed from the contacting of trenches with the portions of wafer 1110 having bonding layer of oxide 1111 applied thereto.

Figure 5:
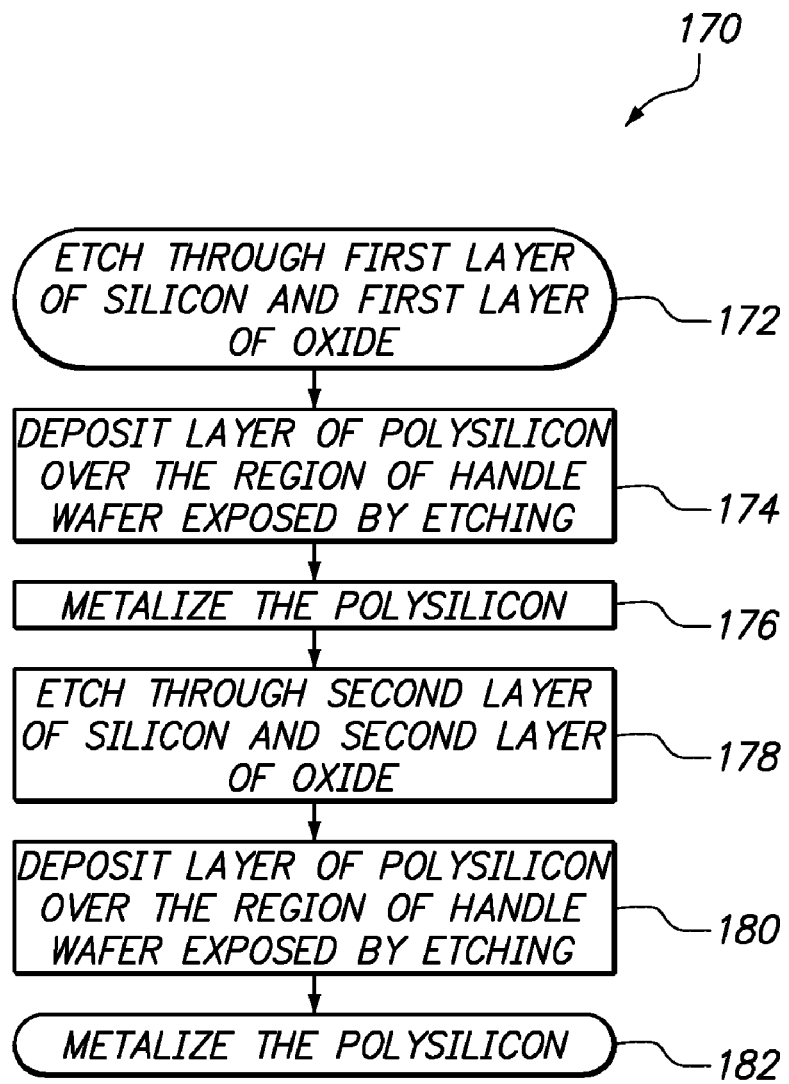
FIG. 5 shows a flowchart of one embodiment of the step of creating one or more electrical contacts on at least one surface of the substrate, in accordance with one embodiment of a method for fabricating a dual-suspension system for MEMS-based devices.
Figure 7:
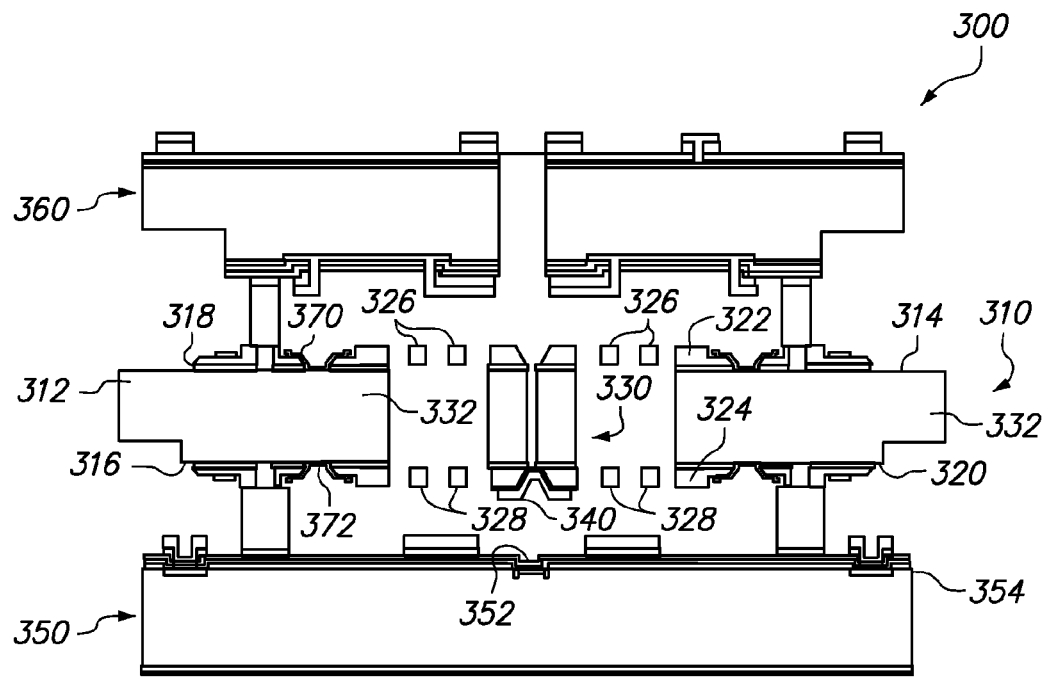
FIG. 7 shows a cross-section view of one embodiment of a MEMS-based device having a dual-suspension system fabricated from an embodiment of a method for fabricating a dual-suspension system for MEMS-based devices.
Figure 9:
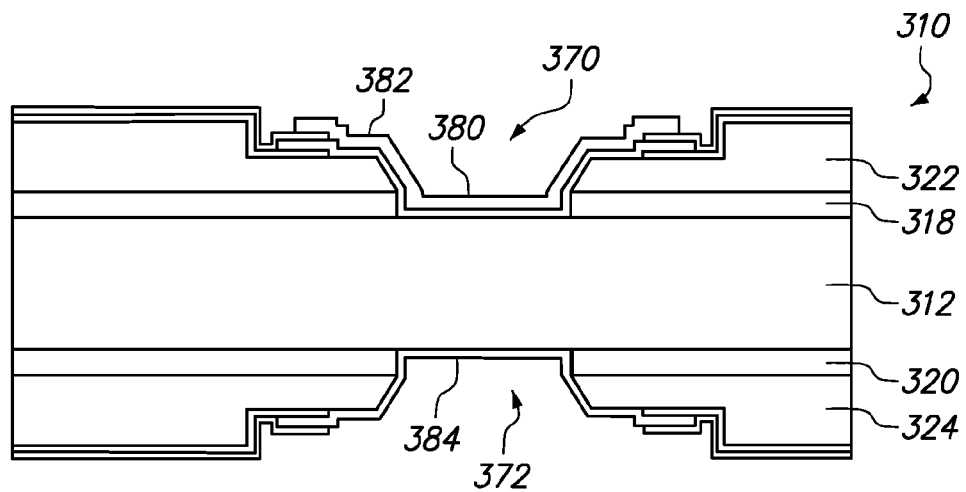
FIG. 9 shows a cross-sectional detailed view of electrical contacts on a portion of the substrate of one embodiment of a MEMS-based device having a dual-suspension system fabricated from an embodiment of a method for fabricating a dual-suspension system for MEMS-based devices.

FIG. 5 shows a flowchart of one embodiment of step 170 of method 100. For illustrative purposes, and without limitation, step 170 will be discussed with reference to device 300 as shown in FIGS. 7 and 9. Step 170 may begin at step 172, where etching occurs through first layer of silicon 322 and first layer of oxide 318. Next, step 174 may involve depositing a layer of polysilicon 380 over at least a portion of the region of handle wafer 312 exposed by the etching from step 172. Following step 174, step 176 may involve metallizing the polysilicon, as shown by layer of metal 382, to allow for wire bonding to a package (not shown). The combination of steps 172, 174, and 176 may be referred to as the process for creating a first electrical contact 370. Next, step 178 may involve etching through second layer of silicon 324 and second layer of oxide 320. Next, step 180 may involve depositing a layer of polysilicon 384 over at least a portion of the region of handle wafer 312 exposed by the etching from step 178. Following step 180, step 182 may involve metallizing the polysilicon to allow for wire bonding to a package (not shown). Step 182 may involve the same process as step 176, with the layer of metal deposited over layer of polysilicon 384. The use of polysilicon may increase the conductivity of substrate 310. The combination of steps 178, 180, and 182 may be referred to as the process for creating a second electrical contact 372. The combination of first electrical contact 370, the second electrical contact 372, and handle wafer 312 may allow for electrical potential to be applied to substrate 310.

Figure 6:
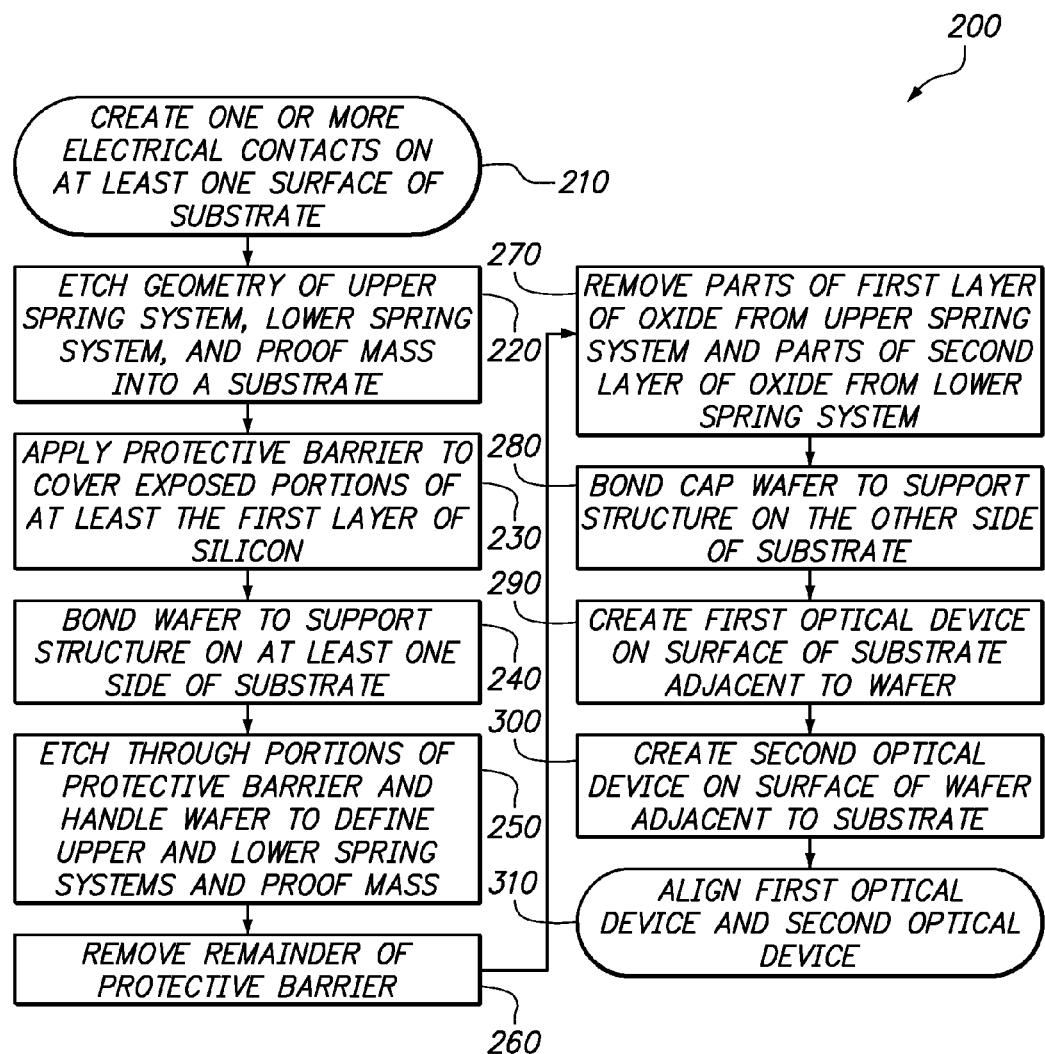
FIG. 6 shows a flowchart of one embodiment of a method for fabricating a dual-suspension system for MEMS-based devices.

FIG. 6 shows a flowchart of one embodiment of a method 200 for fabricating a dual-suspension system for MEMS-based devices. For illustrative purposes, and without limitation, method 200 will be discussed with reference to the devices and processes shown in FIGS. 14A through 14E, FIGS. 15A through 15R, and FIGS. 17A through 17E. Method 200 may begin at step 210, where one or more electrical contacts are created on at least one surface of substrate. As an example, step 210 may occur similar to the process described with reference to step 170 as discussed above.

Next, step 220 may involve etching the geometry of an upper spring system, lower spring system, and proof mass into a substrate. As an example, step 220 may occur similar to the process described with reference to step 20 as discussed above.

Method 200 may next proceed to step 230, where a protective barrier is applied to cover at least the exposed portions of the first layer of silicon. As an example, step 230 may occur similar to the process described with reference to step 30 as discussed above. Following step 230, step 240 may involve bonding a wafer to support structure on at least one side of substrate. Bonding of the wafer may be performed to allow the lower electrode layer to either electro-statically attract the proof mass/suspension system to adjust the spacing, or to sense the displacement via capacitance changes or other pick-off techniques that are dependent upon a physical change in spacing. The bonding may be done prior to etching since the starting material may become fragile and difficult to handle after the etching, depending on the geometries of the proof mass/suspension system. Attachment to the lower electrode wafer prior to etching allows for easier handling of the substrate after etching. As an example, step 240 may occur similar to the process described with reference to step 130 as discussed above.

Next, step 250 may involve etching through portions of protective barrier and handle wafer to define the shapes of upper spring system, lower spring system, and proof mass. As an example, step 250 may occur similar to the process described with reference to step 40 as discussed above. Next, step 260 may involve removing the remainder of protective barrier. As an example, step 260 may occur similar to the process described with reference to step 50 as discussed above. Method 200 may then proceed to step 270, where first layer of oxide is removed from the areas in contact with upper spring system and second layer of oxide is removed from the areas in contact with lower spring system. As an example, step 270 may occur similar to the process described with reference to step 60 as discussed above. Following step 270, step 280 may involve bonding a cap wafer to support structure on the other side of substrate. As an example, step 280 may occur similar to the process described with reference to step 130 as discussed above.

Next, method 200 may proceed to step 290, where a first optical device is created within a substrate. As an example, the creation of a first optical device, such as mirror 820, on a substrate, such as substrate 800, is depicted between FIGS. 14A through 14C and described with reference to those figures. Following step 290, step 300 may involve creating a second optical device within the surface of wafer adjacent to substrate. As an example, the creation of a second optical device, such as mirror 918 or a photo detector, on a substrate, such as substrate 900, is depicted at least between FIGS. 15F and 15G, and described with reference to those figures. Method 200 may then conclude at step 310, where the first optical device is aligned with the second optical device such that light passing through first optical device may contact second optical device. An example of the alignment of a first optical device, such as optical device 412 to a second optical device, such as optical device 414, may be seen in FIG. 8. The alignment of optical device 412 to optical device 414 may allow light, shown by arrows 450, to flow from an optical light source 440 through optical device 412 to optical device 414. Optical devices 412 and 414 may comprise various optical devices as would be recognized by one having ordinary skill in the art.

FIG. 7 shows a cross-section view of one embodiment of a MEMS-based device 300 having a dual-suspension system fabricated from an embodiment of a method for fabricating a dual-suspension system for MEMS-based devices. Device 300 may contain a substrate 310. Substrate 310 may include a handle wafer 312 having a first side 314 and a second side 316. Substrate 310 may also include a first layer of oxide 318, which initially covers first side 314 and a second layer of oxide 320, which initially covers second side 316. Substrate 310 may further include a first layer of silicon 322, which initially covers first layer of oxide 318 and a second layer of silicon 324, which initially covers second layer of oxide 320. As shown, layers of oxide 318 and 320 and layers of silicon 322 and 324 are not contiguous, as they are the result of several etching processes. For symmetry, the initial layers of oxide 318 and 320 may have the same thickness. Similarly, for symmetry, the initial layers of silicon 322 and 324 may have the same thickness. In some embodiments, the initial thickness of handle wafer 312 and layers of silicon 322 and 324 may be independently selected to suit the mechanical displacement sensitivity, resonant frequency, etc requirements of a given application. Handle wafer 312 and layers of silicon 322 and 324 may be comprised of crystalline silicon with their respective orientation, e.g. (100), (110), (111), etc...., dependent upon the eventual geometry used to define the dual-suspension system of device 300. The use of crystalline silicon to form the dual-suspension, rather than amorphous silicon, increases the repeatability of the mechanical properties of device 300, as well as reduces any hysteretic effects and long-term aging effects.

Substrate 310 may also include an upper spring system 326 formed from first layer of silicon 322 and a lower spring system 328 formed from second layer of silicon 324. Substrate 310 may further include a proof mass 330 partially formed from first layer of silicon 322 and second layer of silicon 324. Together, upper spring system 326 and lower spring system 328 may be referred to as a dual-suspension system for proof mass 330. A support structure 332 may be defined by the regions 334 and 336 of substrate 310 opposite proof mass 330 and adjacent to upper spring system 326 and lower spring system 328.

Device 300 may further include a first optical device 340 coupled to substrate 310. Device 300 may also include a wafer 350 bonded on at least one side of substrate 310 to support structure 332. Wafer 350 may have a second optical device 352 coupled to the surface 354 of wafer 350 adjacent to substrate 310. Device 300 may also contain a cap wafer 360 bonded to support structure 332 on the side of substrate 310 near upper spring system 326. Device 300 may further comprise a first electrical contact 370 on first side 314 of substrate 310 and a second electrical contact 372 on second side 316. First electrical contact 370, second electrical contact 372, and handle wafer 312 may allow for electrical potential to be applied to substrate 310.

Figure 8:
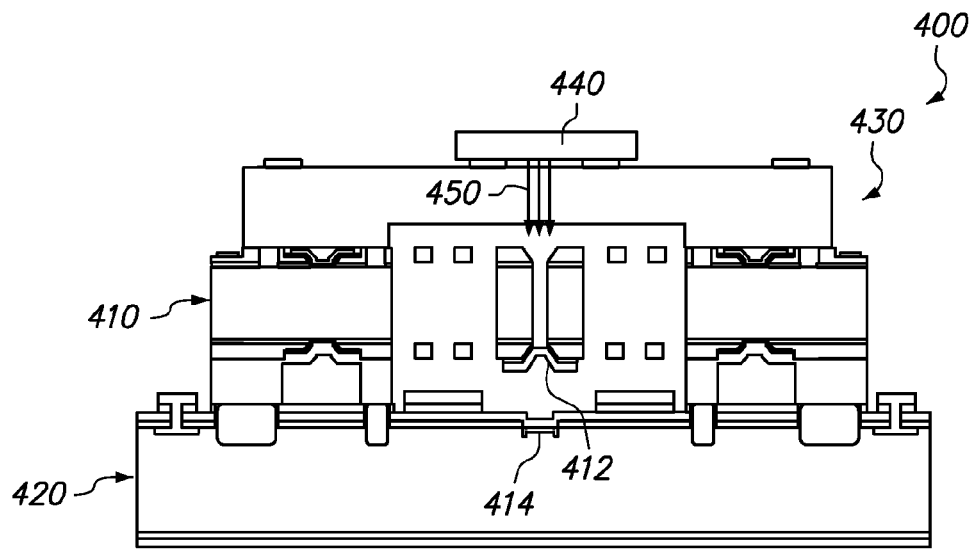
FIG. 8 shows a cross-section view of one embodiment of a MEMS-based device with an optical light source having a dual-suspension system fabricated from an embodiment of a method for fabricating a dual-suspension system for MEMS-based devices.

FIG. 8 shows a cross-section view of one embodiment of a MEMS-based device 400 fabricated from an embodiment of a method for fabricating a dual-suspension system for MEMS-based devices. Device 400 may include a substrate 410, a wafer 420, and a cap wafer 430. Substrate 410 may be similar to substrate 310 and may contain a first optical device 412. Wafer 420 may be similar to wafer 312 and may contain a second optical device 414. Cap wafer 430 may include an optical light source 440 coupled thereto. Optical light source 440 may be aligned with first optical device 412 such that light shown by arrows 450 may pass from optical light source 440 through first optical device 412 to the second optical device 414. In some embodiments, wafer 420 may be comprised of an optically transparent material, such as fused silica or quartz, such that light may pass from optical light source 440 through wafer 420 and through first optical device 412 to second optical device 414. In some embodiments, wafer 420 contains a cavity therethrough (for example, see FIG. 7), wherein light may pass from optical light source 440 through the cavity and through first optical device 412 to second optical device 414. Optical light source 440 may be a semiconducting laser, such as a vertical cavity surface laser or an edge emitting semi-conducting laser, or optical light source 440 may be a light emitting diode. As shown, wafer 420 and cap wafer 430 may be bonded to substrate 410 differently that the bonding of wafer 350 and cap wafer 360 to substrate 310 (see FIG. 7).

FIG. 9 shows a cross-sectional detailed view of first electrical contact 370 and second electrical contact 372 on a portion of substrate 310. Electrical contact 370 may have a layer of polysilicon 380 deposited over the exposed region left from the etching of first layer of silicon 322 and first layer of oxide 318. In some embodiments, layer of polysilicon 380 may overlap a portion of first layer of silicon 322. Layer of polysilicon 380 may be "metallized" by depositing a layer of metal 382 over the layer of polysilicon 380. Electrical contact 372 may have a layer of polysilicon 384 deposited over the exposed region left from the etching of second layer of silicon 324 and second layer of oxide 320. In some embodiments, layer of polysilicon 380 may overlap a portion of second layer of silicon 324. Layer of polysilicon 384 may be "metallized" by depositing a layer of metal (not shown) over the layer of polysilicon 384. In some embodiments, electrical contact 370 may not have a layer of polysilicon 380. In some embodiments, electrical contact 372 may not have a layer of polysilicon 382, but may only contain a layer of metal.

Figure 10:
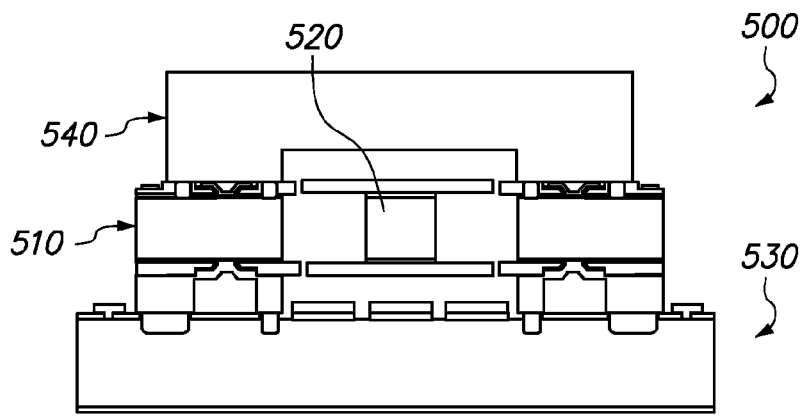
FIG. 10 shows a cross-section view of one embodiment of a MEMS-based device having a comb-drive structure and a dual-suspension system fabricated from an embodiment of a method for fabricating a dual-suspension system for MEMS-based devices.

FIG. 10 shows a cross-section view of one embodiment of a MEMS-based device 500 fabricated from an embodiment of a method for fabricating a dual-suspension system for MEMS-based devices. Device 500 may include a substrate 510, a wafer 530, and a cap wafer 540. Substrate 510 may be similar to substrate 510 and may also contain comb-drive structure 520. Wafer 530 may be similar to wafer 312.

Figure 11:
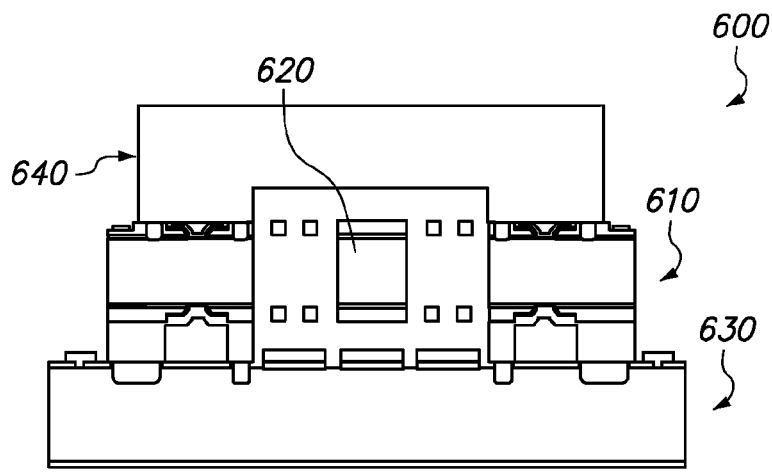
FIG. 11 shows a cross-section view of one embodiment of a MEMS-based device having a capacitive pickoff structure and a dual-suspension system fabricated from an embodiment of a method for fabricating a dual-suspension system for MEMS-based devices.

FIG. 11 shows a cross-section view of one embodiment of a MEMS-based device 600 fabricated from an embodiment of a method for fabricating a dual-suspension system for MEMS-based devices. Device 600 may include a substrate 610, a wafer 630, and a cap wafer 640. Substrate 610 may be similar to substrate 610 and may also contain a capacitive pickoff structure 620. Wafer 630 may be similar to wafer 312.

Figure 12:
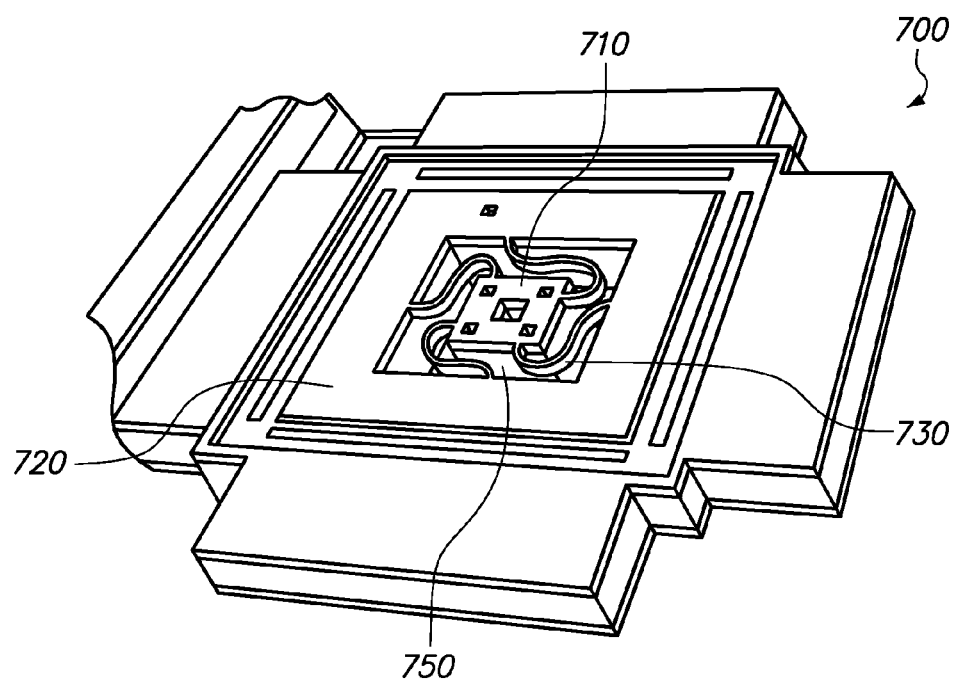
FIG. 12 shows a top perspective view of one embodiment of a MEMS-based device having a dual-suspension system fabricated from an embodiment of a method for fabricating a dual-suspension system for MEMS-based devices.
Figure 13:
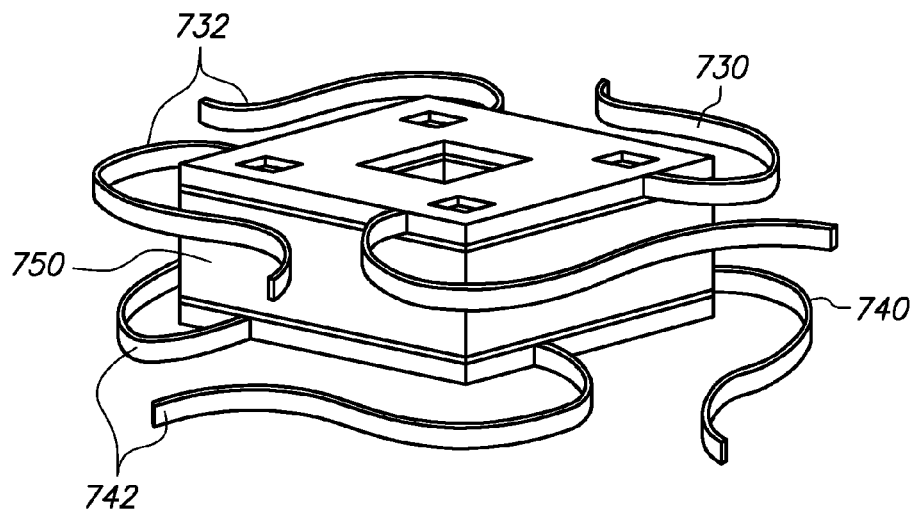
FIG. 13 shows a side perspective view of the proof mass and dual-suspension system of one embodiment of a MEMS-based device having a dual-suspension system fabricated from an embodiment of a method for fabricating a dual-suspension system for MEMS-based devices.

Referring to FIGS. 12 and 13, FIG. 12 shows a top perspective view of one embodiment of a MEMS-based device 700. Device 700 may include a dual-suspension system 710 fabricated from an embodiment of a method for fabricating a dual-suspension system for MEMS-based devices. As shown, dual-suspension system 710 is surrounded by support structure 720. Dual-suspension system 710 may include an upper spring system 730 and a lower spring system 740. FIG. 13 shows a side perspective view of the proof mass 750 and the dual-suspension system 710 of device 700. Support structure 720, upper spring system 730, lower spring system 740, and proof mass 750 may be formed from a substrate similar to substrate 310. Upper spring system 730 may be formed from the first layer of silicon of the substrate and a lower spring system 740 formed from the second layer of silicon of the substrate. Proof mass 750 may be formed from the first layer of silicon, the handle wafer, and the second layer of silicon.

Upper spring system 730 may contain springs 732 and lower spring system 740 may contain springs 742. Springs 732 and 742 may extend from proof mass 750. Springs 732 and 742 may vary in shape. For example, springs 732 and 742 may be curved in shape, as shown. In other embodiments, springs 732 and 742 may be linear, angled, or any other design as recognized by one having ordinary skill in the art. Further, springs 732 and 742 may vary in orientation with respect to proof mass 750. As an example, each of springs 732 may be oriented on a different side of proof mass 750 and each of springs 742 may be oriented on a different side of proof mass 750, as shown. In other embodiments, more than one spring 732 or 742 may extend from one side of proof mass 750, or no springs may extend from a particular side of proof mass 750. The orientation of springs 732 and 742 may depend on the shape of proof mass 750. For example, in an embodiment wherein proof mass 750 is circular or otherwise curved in shape, springs 732 and/or 742 may be placed at various spaced intervals along the perimeter of proof mass 750. The design of the upper spring system 730 and lower spring system 740 may be any arbitrary pattern definable through photolithographic steps and etching, for example Deep Reactive Ion Etching (DRIE). The suspension system can be designed such that upper spring system 730 and lower spring system 740 are symmetric, 180 degrees out of phase with one another, or two different geometries altogether.

Specific Example

Figure 14A:
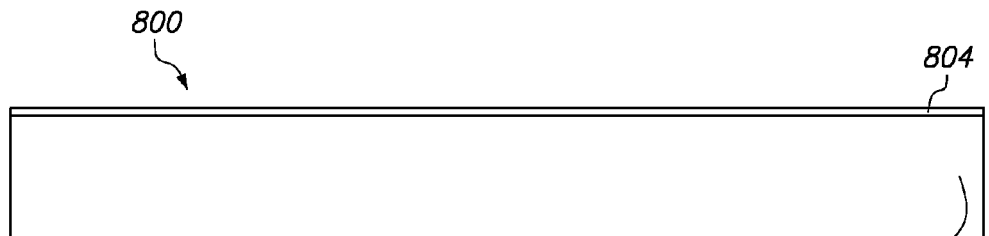
FIGS. 14A-14E show cross-sectional views of specific steps of an embodiment of the fabrication process of a wafer having an optical device therein, for inclusion within one embodiment of a MEMS-based device having a dual-suspension system fabricated from an embodiment of a method for fabricating a dual-suspension system for MEMS-based devices.

Referring now to FIGS. 14A-14E, there are shown cross-sectional views of the results of specific processes of an embodiment of the fabrication process of a wafer 800 having an optical device therein comprised of a mirror and aligned photo detector. The resulting wafer 800 may be included within one embodiment of a MEMS-based device having a dual-suspension system fabricated from an embodiment of a method for fabricating a dual-suspension system for MEMS-based devices. FIG. 14A shows an example of an initial starting wafer 800. Wafer 800 may be bonded to the underside of a substrate to form part of a MEMS-based device. Wafer 800 may include a substrate 802, a first layer of oxide 804, and a second layer of oxide 806. Handle wafer 802 may be comprised low-doped, n-type (100) Si that is polished on both sides. Polishing both sides benefits subsequent Infrared (IR) imaging if desired. As an example, handle wafer 802 may be 4" in diameter and 400 micron thick. First layer of oxide 804 and second layer of oxide 806 may comprise a thin thermal oxide. The process may involve photolithography and subsequent dry or wet etching of the oxide 804. The openings created in oxide 804 are used to define implant areas for the p-type anode implantation and n-type cathode electrode implantations. Next, screening oxide (not shown) may be grown on both first layer of oxide 804 and second layer of oxide 806. The screening oxide should be of sufficient thickness to protect the silicon substrate during subsequent ion implantation used to define active photodiode junctions and substrate contacts within the substrate.

Figure 14B:
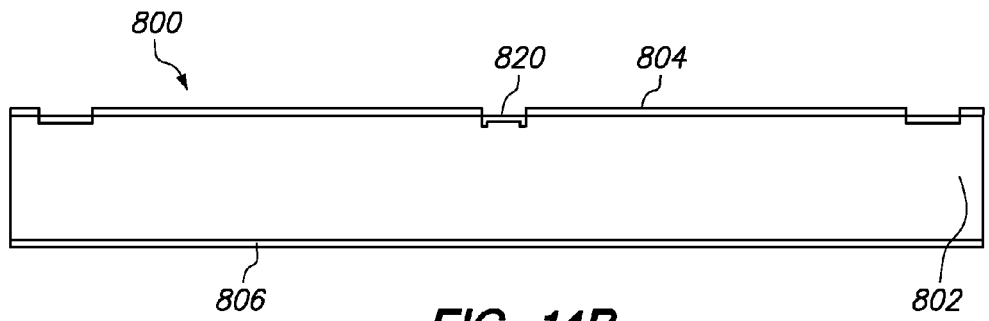

FIG. 14B shows the result of a process after both active photodiode junctions and low-resistivity ohmic substrate contacts have been formed. First, lithography may be performed on first layer of oxide 804, followed by a Boron implantation of layer of oxide 804 at a dose and energy sufficient to create a shallow one-sided photodiode junction. The shallow one-sided photodiode junction increases the efficiency of generating current from incident optical light. Next, a Phosphor implantation of first layer of oxide 804 at a dose and energy sufficient to create a low-resistivity ohmic contact may occur in an area beyond the extent of the active photodiode junction. Next, a drive-in period may follow, to insure that the implanted dopants are activated and diffused to the correct depth within the substrate material. Finally, a diluted hydrofluoric acid or buffered oxide etch may remove of the entirety of the screening oxide from first layer of oxide 804 and second layer of oxide 806.

Figure 14C:
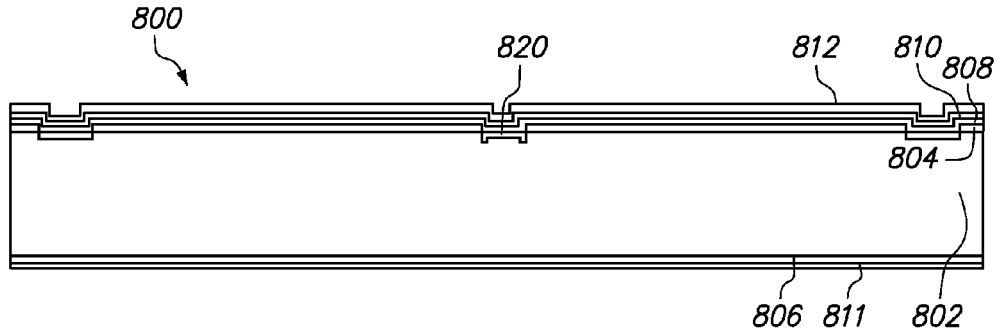

FIG. 14C shows the result of a process for depositing a dielectric mirror over the active photodiode junction and protecting the mirror with a protective oxide layer. The dielectric mirror may be made of any binary material system whereby the index of refraction of the first material is different from the index of refraction of the second material. Alternating layers of material one 808 and material two 810 create a mirror provided that the thickness of each layer is equivalent odd multiples of the wavelength of light divided by the index of refraction. In this example, material one is a plasma enhanced oxide (PETEOS) 808 and material two is a furnace deposited silicon nitride 810. Additional binary layers may be deposited to increase the overall reflectivity of the mirror if desired. Finally, a layer of a sacrificial oxide 812, such as PETEOS, may be deposited on layer 810 to protect the mirror during subsequent processing.

Figure 14D:
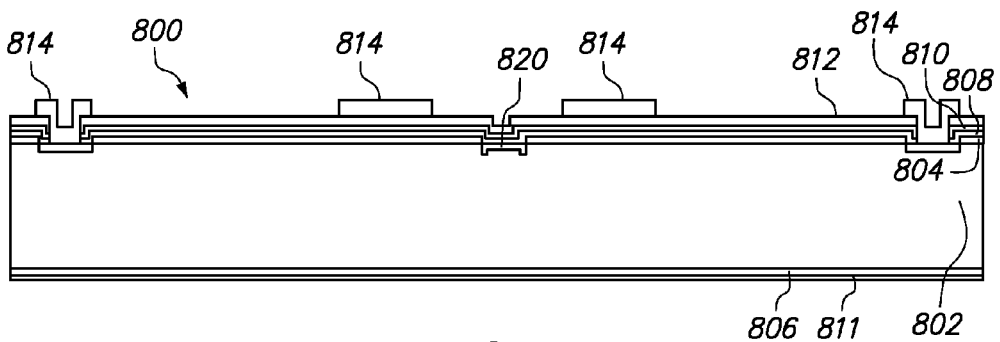

FIG. 14D shows the result of a process after metal contacts and electrodes have been deposited and patterned. First, lithography may be performed on layer 812 to create openings to make contact to either the implanted anode regions or the implanted low-resistivity ohmic contact regions. Next, a combination of dry or wet etching may be used to selectively etch through the sacrificial oxide protecting the mirror and the layers comprising the mirrors 808 and 810. Next, a thin barrier metal layer followed by a low-resistivity metal 814 suitable for electrical connection may be deposited via sputter deposition or evaporation techniques. Next, portions of layer 814 may be dry etched to form electrical contact to the anode and cathode regions as well a forming electrodes for controlling the position of the proof mass after subsequent wafer bonding. Finally, sintering of the wafer at a reasonable time and temperature for the metal 814 chosen may be done to decrease electrical resistivity of the anode and cathode connections.

Figure 14E:
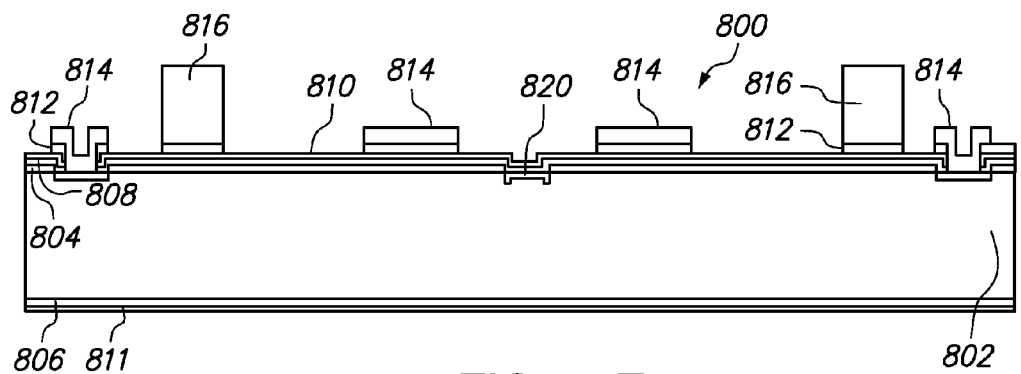

FIG. 14E shows the result of a process after a spacer oxide 816 has been deposited and patterned. The thickness of the spacer oxide 816 will determine the spacing between a mechanical wafer 900 and the lower substrate 800 First, spacers 816 may be deposited on layer 812. Spacers 816 may be comprised of oxide and may be of appropriate thickness for the desired spacing between subsequently bonded wafers 900 and 800. Next, lithography may occur on spacers 816, followed by a dry or wet etch of spacer 816. Next, a pad etch may be performed on layer 812. It is important that the etch of oxide spacer 816 not damage the previously deposited metal layer 814.

Referring now to FIGS. 15A-15R, there are shown cross-sectional views of the results of specific processes of an embodiment of the fabrication process of a substrate 900 having an optical device therein. The resulting substrate 900 may be included within one embodiment of a MEMS-based device having a dual-suspension system fabricated from an embodiment of a method for fabricating a dual-suspension system for MEMS-based devices. Substrate 900 may have a wafer (such as wafer 800) bonded to one end and a cap wafer (such as cap wafer 1100) bonded to the other end, to create a MEMS-based device. FIG. 15A shows an example of an initial starting substrate 900. Substrate 900 may include a handle wafer 902, a first layer of oxide 904, a second layer of oxide 906, a first layer of silicon 908, and a second layer of silicon 910. Handle wafer 902 may be of sufficient thickness to ensure rigidity of the overall wafer and desired mechanical properties after processing and may be comprised of (100) Si. The choice of alternate crystallographic orientations may be desired based on desired etch stop planes required to achieve required geometries. Layers of oxide 904 and 906 may be of sufficient thickness to act as etch stops during subsequent deep silicon etch through the handle wafer 902. Layers of silicon 908 and 910 may be of sufficient thickness in order to achieve desired mechanical spring constants and resonant frequencies. Crystallographic orientation of silicon 908 and 910 is typically (100) but may be altered to optimize spring characteristics and minimize buckling and potential hysterisis by selecting crystallographic orientations and spring geometries that minimize thermal expansion of silicon 908 and 910 with respect to handle wafer 902 and wafers 800 and 1100.

Figure 15B:
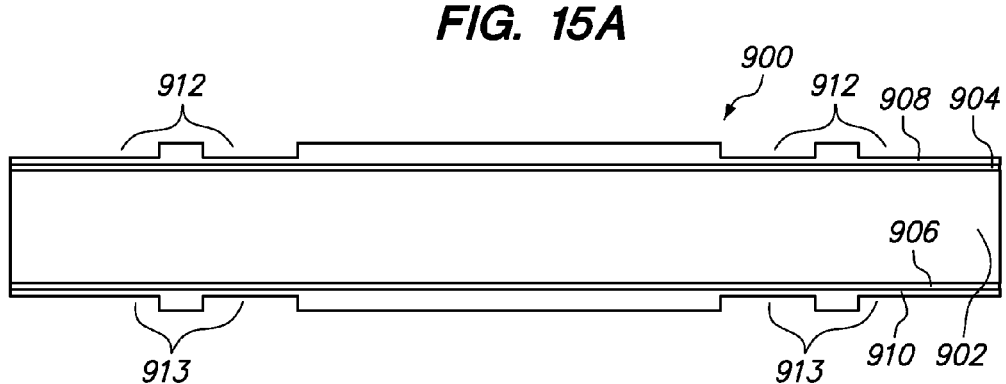

FIG. 15B shows the result of a process for the creation of partial trenches used to ensure that all subsequent depositions and etches are below the surface of silicon layers 908 and 910 The trench depth should be less than the thickness of silicon 908 and 910 but greater than the thickness of and subsequent material deposition. This insures that applied force during the wafer bonding process is applied uniformly across the surface of 900 and that the spacing between either 900 and 800 or 900 and 1000 is based on a fixed referenced surface, namely the top level of either silicon 908 or 910. First, a layer of thermal oxide (not shown) may be grown on layers of silicon 908 and 910. Then, lithography may be performed to create openings where the trenches will be formed, followed by a dry oxide etch of the layer of thermal oxide on layer of silicon 908, and layer of silicon 908, to create trenches 912 in layer of silicon 908. For symmetry purposes the trench should be created in a radially symmetric pattern about the eventual location where the proof mass will be located. Then, lithography may be performed, followed by a dry oxide etch of the layer of thermal oxide on layer of silicon 910, and layer of silicon 910. A wet TMAH/KOH silicon etch or dry silicon etch may be used to create trenches 913 in layer of silicon 910. For symmetry purposes all photolithographic patterns created on layers 908 should be the same as those patterned on layer 910 and aligned to one another.

Figure 15C:
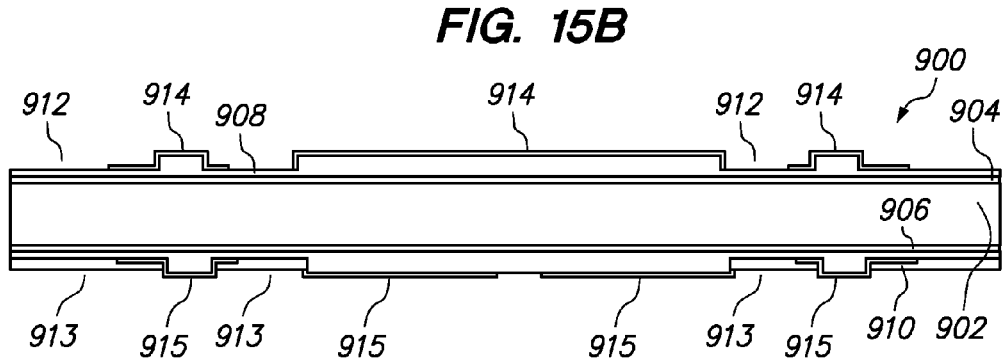
Figure 15D:
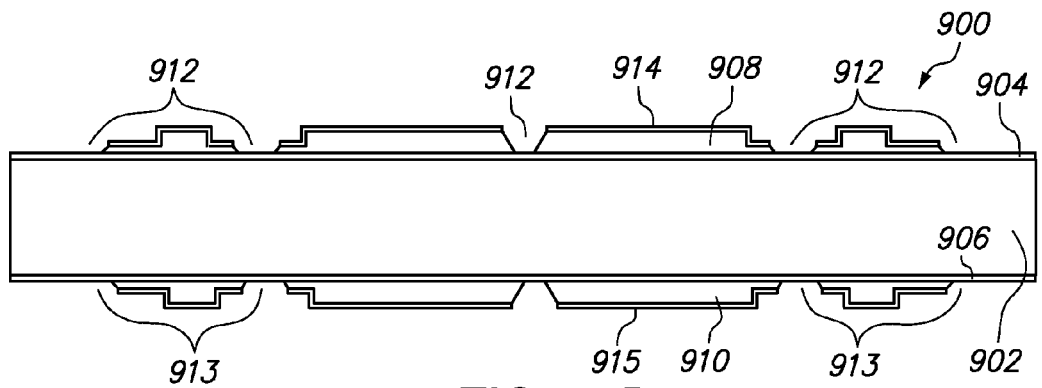
Figure 15E:
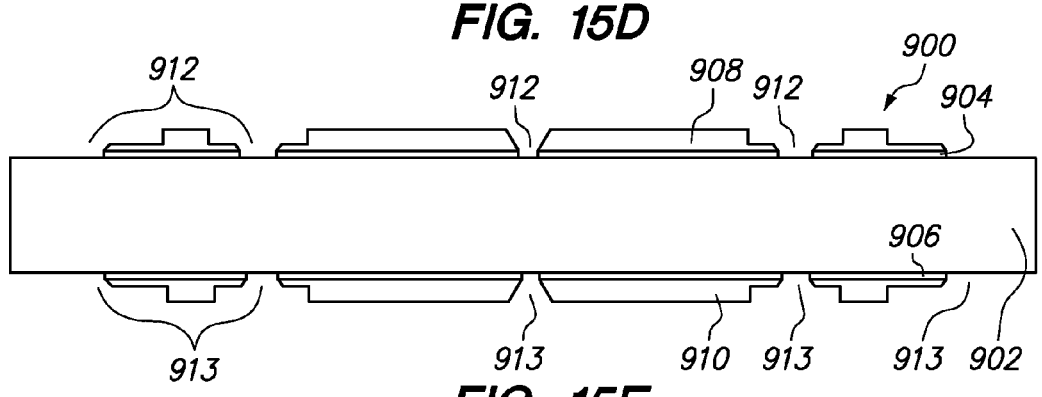

FIG. 15C shows the result of a process for depositing a sacrificial oxide to define a subsequent trench etch First, an oxide 914 and 917 is grown or deposited on the surface of layers 908 and 910. Next, lithography and subsequent wet or dry etching may be used to create openings in oxide 914 and 917 within the trenches 912 and 913. FIG. 15D shows the result of a process for creating trenches used to contact the handle wafer 902 and create optical openings in silicon layers 908 and 910 To accomplish this, a wet TMAH/KOH silicon etch or dry silicon etch may occur on layers of silicon 908 and 910 and ending on oxide layers 904 and 906 respectively. During the time of this silicon etch, openings defined in the previous photolithographic step may be used to create optical openings in silicon layers 908 and 910. FIG. 15E shows the result of a process for removing portions of layers of oxide 904 and 906. This may be achieved by performing a wet or dry oxide etch within the exposed regions of trenches 912 and 913.

Figure 15F:
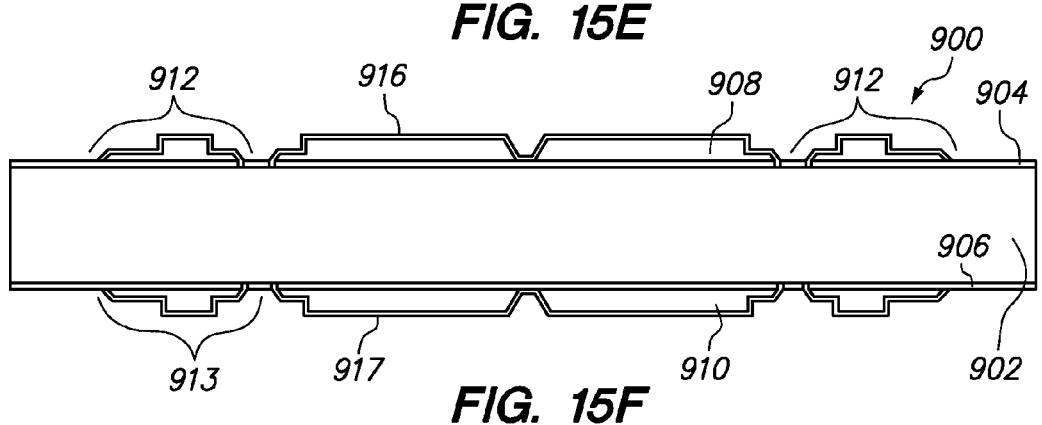

FIG. 15F shows the process of depositing a low-stress oxide over the portions of handle wafer 902 and layers of silicon 904 and 906 exposed by the previous etching. A low-stress oxide may be used to help reduce the amount of stress inherent in oxide layers 904 and 906. This reduction in stress is beneficial to help mitigate mechanical bowing and warping of wafer 900 and facilitate subsequent bonding to wafers 800 and 1000. This figure shows the result of depositing a low stress oxide 916 on layer of silicon 908 and the portions of handle wafer 902 exposed by the previous etching, and depositing a low stress oxide 917 on layer of silicon 910 and the portions of handle wafer 902 exposed by the previous etching.

Figure 15G:
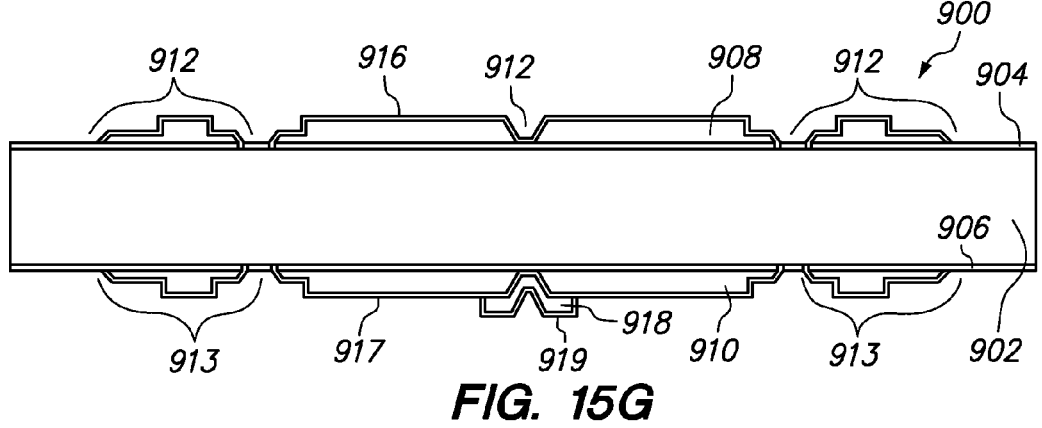

FIG. 15G shows the result of a process for depositing the upper mirror and performing lithography on the upper mirror. This figure shows the result of depositing a dielectric mirror similar to the mirror deposited on wafer 800. In this instance, the most-simple mirror configuration is comprised of three layers of high, medium and high index of refraction. Additional binary layers may be used to increase the reflectivity of the upper mirror. Next, lithography may be performed on the upper mirror to define its geometry and location. Then, combination of wet and dry etching of the upper mirror may be performed. Next, an oxide layer 919 of sufficient thickness may be deposited on layer 918 to protect the upper mirror.

Figure 15H:
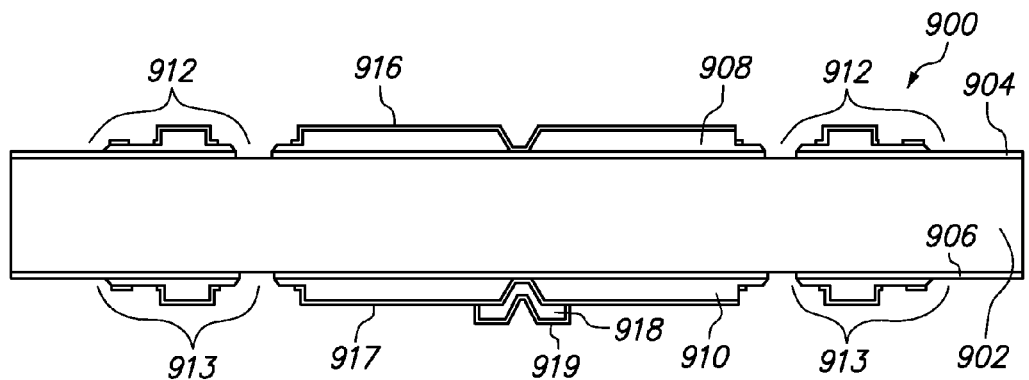
Figure 15I:
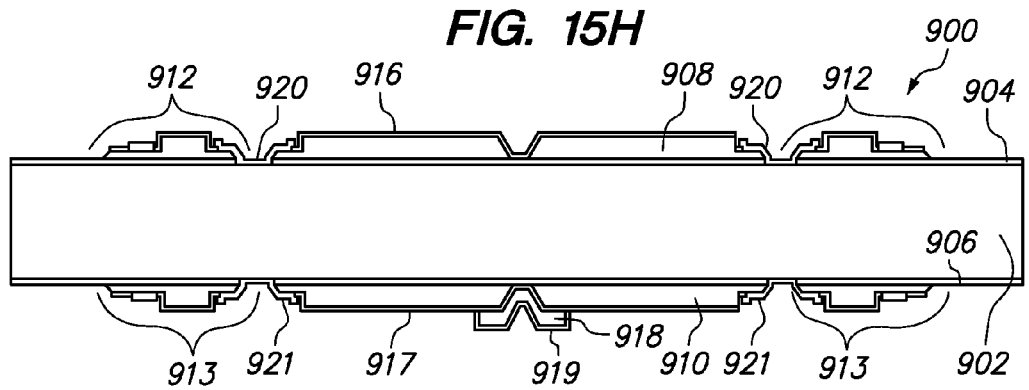

FIG. 15H shows the result of a process for preparing substrate 900 for the creation of electrical contacts. First, lithography may be performed to remove oxide layer 919 protecting the substrate 902 over trench areas 912 and 913. Then, a dry etch of oxide 919 and portions of layer 916 and 917 within trenches 912 and 913 respectively may be performed. The etching may be performed to clear the oxide for subsequent metallization of trenches 912 and 913 to create electrical contacts on substrate 900. FIG. 15I shows the result of a process for creating electrical contacts. First, a buffered oxide etch may be performed on the exposed portions of handle wafer 902 within trenches 912 and 913 to remove any residual oxides that may exist. Next, a layer of polysilicon (not shown) may be deposited over portions of some of trenches 912 and 913. The polysilicon may be implanted to help provide better conductivity for substrate 900. Next, a layer 920 and 921 of metallization may be deposited in some or all of trenches 912 and 913 over the polysilicon (if used) or handle wafer 902 (if no polysilicon used). Next, lithography may be performed on layer 920 and 921, followed by a dry or wet silicon etch of portions of layer 920 and 921. Finally, substrate 900 may be sintered to electrically activate the dopant if implantation of the polysilicon occurred.

Figure 15J:
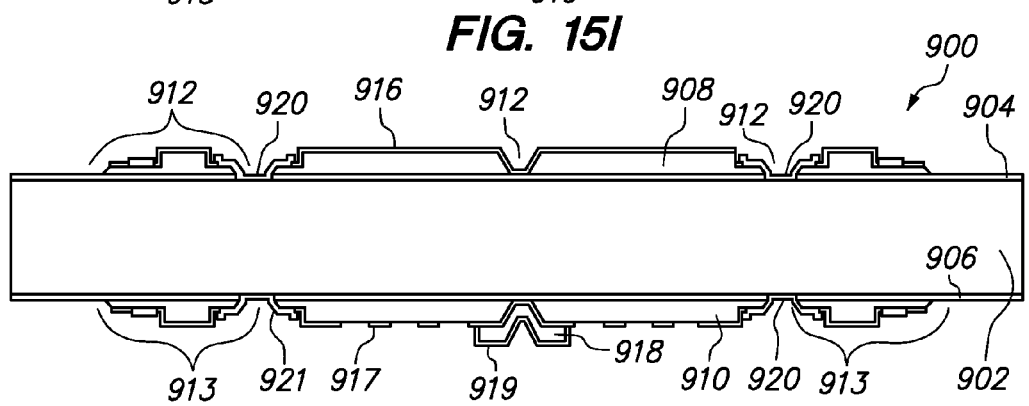
Figure 15K:
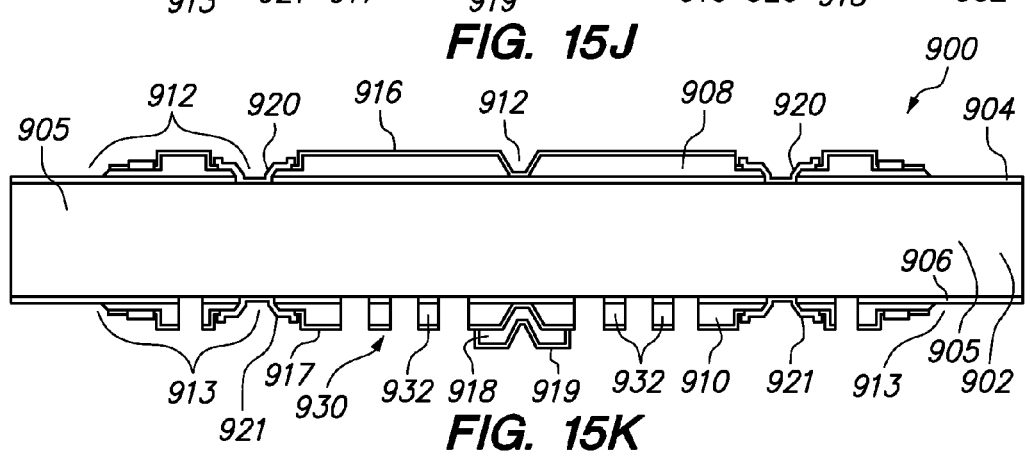

FIG. 15J shows the result of a process for preparing for a subsequent etching of layer of silicon 910 used to create the lower springs 930. First, lithography may be performed to create the desired spring geometry on silicon layer 910. Then, a dry or wet etch of portions of oxide layer 917 may be performed. FIG. 15K shows the result of a process for etching the geometry of the lower spring system 930 into layer of silicon 910 and layer of oxide 906. First, a Deep Reactive Ion Etch (DRIE) or wet TMAH/KOH etch is used to etch through layer of silicon 910 while stopping on oxide layer 906. Next, a dry or wet etch of portions of layer of oxide 906 may occur. Lower spring system 930 may contain multiple springs 932. FIG. 15L shows the result of a process for preparing for a subsequent etching of layer of silicon 908 used to create upper springs 940. First, lithography may be performed to create the desired spring geometry on silicon layer 908. Then, a dry etch of portions of layer 916 may be performed. FIG. 15M shows the result of a process for etching the geometry of the upper spring system 940 into layer of silicon 908 and layer of oxide 904. First, a Deep Reactive Ion Etch (DRIE) or wet TMAH/KOH silicon etch of silicon 908 may occur. Next, a dry or wet etch of portions of layer of oxide 904 may occur. Upper spring system 940 may contain multiple springs 942.

FIG. 15N shows the result of a process for applying a protective barrier to cover at least the exposed portions of lower spring system 930 and upper spring system 940 during the subsequent etching through handle wafer 902. To accomplish this, low stress layer of oxide 950 such as plasma enhanced oxide (PETEOS) may be deposited on one side of substrate 900, including over layer 916, and an equivalent low stress oxide layer 951 may be deposited on the other side of substrate 900, including over layer 917. Layers 950 and 951 may cover all of the exposed silicon portions of lower spring system 930 and upper spring system 940. FIG. 15O shows the result of a process for defining the shape of the outer region 952 of substrate 900. This step is only necessary for situations where partial saw dicing from the top is desired. In this instance the saw blade could inadvertently go into any subsequent layers bonded beneath wafer 900 if these recessed trenches were not present. First, lithography may be performed on the bottom side of wafer 900. Next, a dry and wet etch may be performed on the oxide layers 951, 917, and 906 around outer region 952. Then, a DRIE of handle wafer 902 of outer region 952 may occur. The depth of 952 is dependent on the depth accuracy of the particular system used.

Figure 15P:
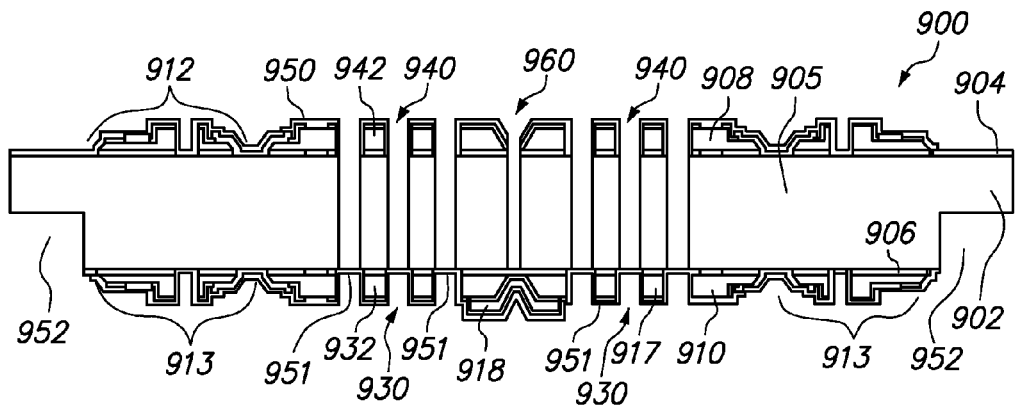
Figure 15Q:
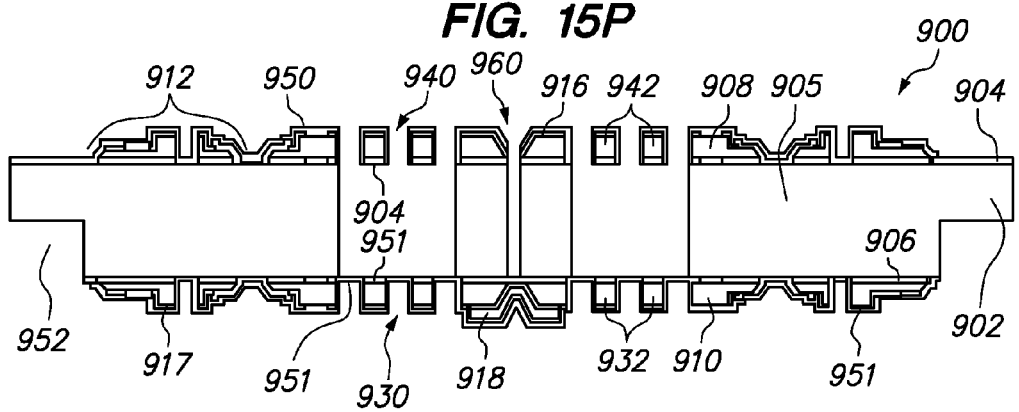
Figure 15R:
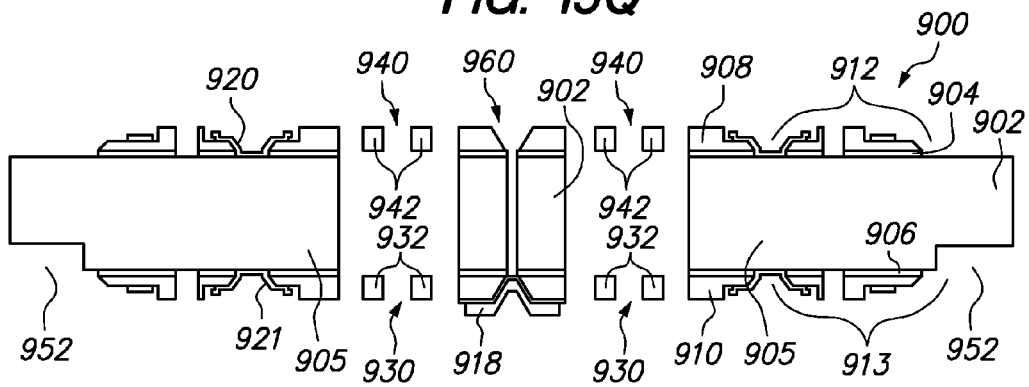

FIG. 15P shows the result of a process for etching through portions of the protective barrier and handle wafer to define lower spring system 930, upper spring system 940, and proof mass 960. First, lithography is performed on the top surface of wafer 900. Next, a dry etch of through layer 950 may occur in the regions between upper spring system 940 and proof mass 960, in the regions between each spring 942, and the regions between upper spring system 940 and the regions of substrate 900 adjacent to upper spring system 940. Then, a DRIE of the handle wafer 902 may occur in the previously etched regions, stopping at oxide layer 951. FIG. 15Q shows the result of a process for etching through the regions beneath each spring 942 of upper spring system 940 and above each spring 932 of lower spring system 930. This may be accomplished by performing a $XeF_2$ etch on handle wafer 902 in those regions, stopping at layer 951. It is to be recognized that in some embodiments, the processing shown in FIGS. 15P and 15Q may be combined into a single step using wet silicon etches such as TMAH or KOH. FIG. 15R shows the result of a process for removing the remainder of protective barriers 950 and 951, as well as removing layers of oxide 916 and 904 in contact with upper spring system 940 and removing layers of oxide 917 and 906 in contact with lower spring system 930. Layers 950 and 951, as well as layers of oxide 916 and 917, may also be removed from other parts of substrate 900 as well. This may be accomplished by performing a pad etch of layers 904, 906, 916, and 917. One or more separate etchings may be required.

Figure 16A:
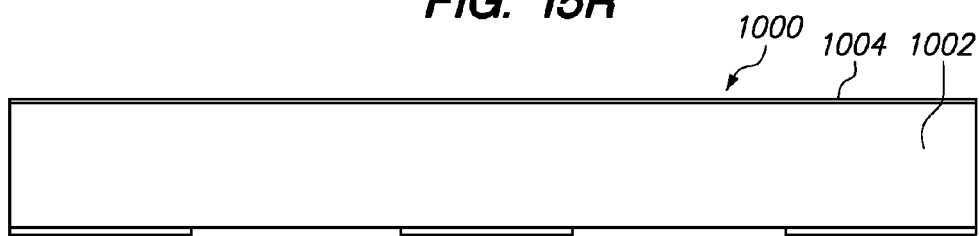
FIGS. 16A-16H show cross-sectional views of specific steps of an embodiment of the fabrication process of a cap wafer for inclusion within one embodiment of a MEMS-based device having a dual-suspension system fabricated from an embodiment of a method for fabricating a dual-suspension system for MEMS-based devices.

Referring now to FIGS. 16A-16H, there are shown cross-sectional views of specific processes of an embodiment of the fabrication process of a cap wafer 1000. The resulting cap wafer 1000 may be included within one embodiment of a MEMS-based device having a dual-suspension system fabricated from an embodiment of a method for fabricating a dual-suspension system for MEMS-based devices. FIG. 16A shows result of the initial processing of cap wafer 1000. Cap wafer 1000 may include a substrate 1002, a first layer of oxide 1004, and a second layer of oxide 1006. Second layer of oxide 1006 may cover only portions of handle wafer 1002. Handle wafer 1002 may be 4" in diameter and may be comprised of low-doped (100) Si. First, a oxide layer may be grown on both sides of 1002 forming layers of oxide 1004 and 1006. Then, lithography may be performed, followed by a dry or wet etch of the thermal oxide layers on layers of oxide 1004 and 1006. Next, a screening oxide layer (not shown) may be grown on layers of oxide 1004 and 1006. The openings created in layers 1004 and 1006 are used to create windows for subsequent implantation into the substrate 1002 thereby creating low-resistivity ohmic contacts or other active photodiode junctions.

Figure 16B:
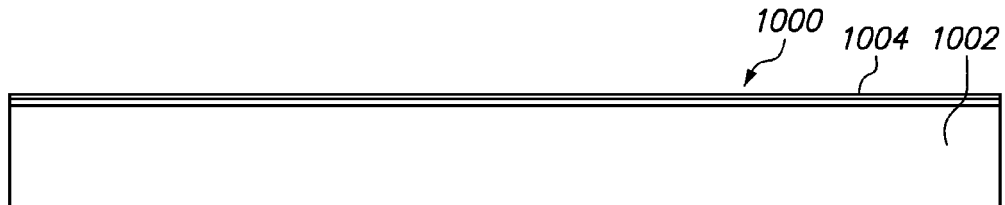
Figure 16C:

FIG. 16B shows the result of a process for implanting both front side and backside ohmic contacts into substrate 1002. First, lithography may be performed, followed by an implantation of a layer 1007 of with a dose and energy suitable to create ohmic contacts on substrate 1002 in the exposed regions between layer of oxide 1006. Then, a similar implantation of layer 1004 dose and energy sufficient to create ohmic contacts on the backside of substrate 1002 may occur. Then, a drive-in period may occur at a suitable temperature and energy to electrically activate the implanted carriers. Finally, a diluted wet oxide etch may remove the screening oxide layers of from layers of oxide 1004 and 1006. FIG. 16C shows the result of a process for creating dielectric mirrors on wafer 1000. The purpose of the mirrors is primarily to duplicate the processing of wafer 800 thereby increasing symmetry and reducing costs through the simultaneous processing of wafers 800 and 1000 through many of the same processing steps. A description of the mirror deposition can be found in the discussion of FIG. 15G.

Figure 16D:
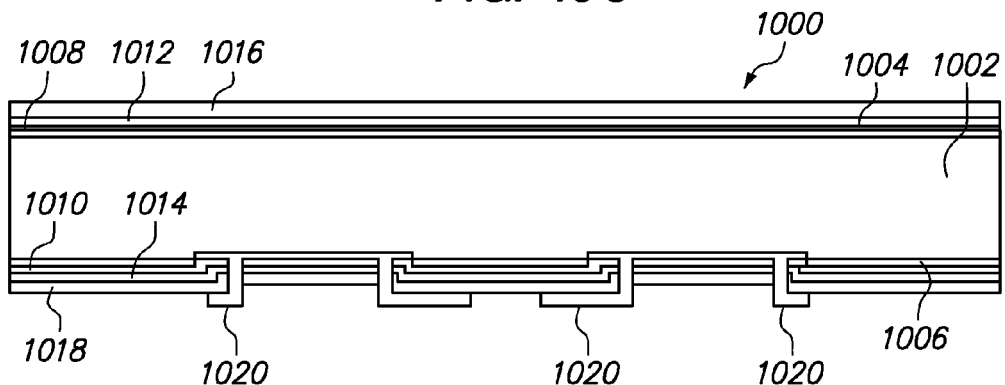
Figure 16E:
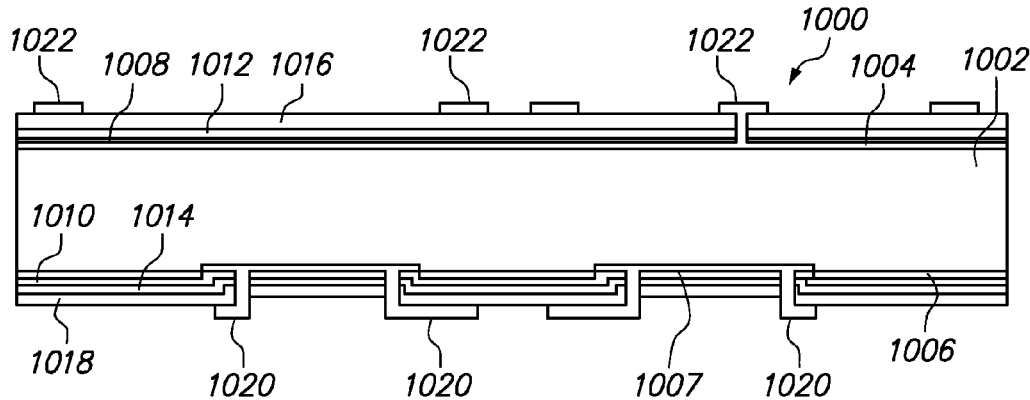

FIG. 16D shows the result of a process for depositing and patterning metal electrodes used to control the position of the proof mass after subsequent wafer bonding. First, lithography may occur on the backside of substrate 1002 and over the regions of the previous implantation. Next, a combination wet and dry etch may occur of portions of layers 1010, 1014, and 1018. Then, a metallization layer 1020 may be deposited on the backside of substrate 1002. Next, lithography of recently deposited metal may occur to define the shape of the metal electrodes, followed by a dry or wet etch of metal layer 1020. FIG. 16E shows the result of a process for creating electrical contacts on the front side of substrate 1002 that are electrically connected to metal electrodes 1020. First, lithography may occur on the front side of substrate 1002, followed by a wet or dry etch of portions of layers 1016, 1012, and 1008. Then, a metal layer 1022 may be deposited on the previously etched portions. Next, lithography of metal layer 1022 may occur, followed by a dry etch of the metal layer 1022. Finally, sintering of wafer 1000 may occur at a suitable time and temperature to reduce ohmic contact resistance between metal layers 1020 and 1022 to implanted regions in substrate 1002.

Figure 16F:
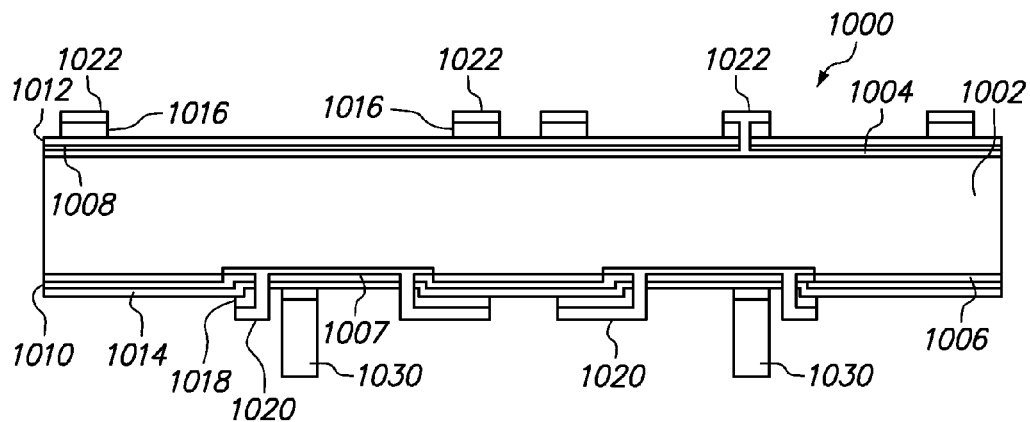
Figure 16G:
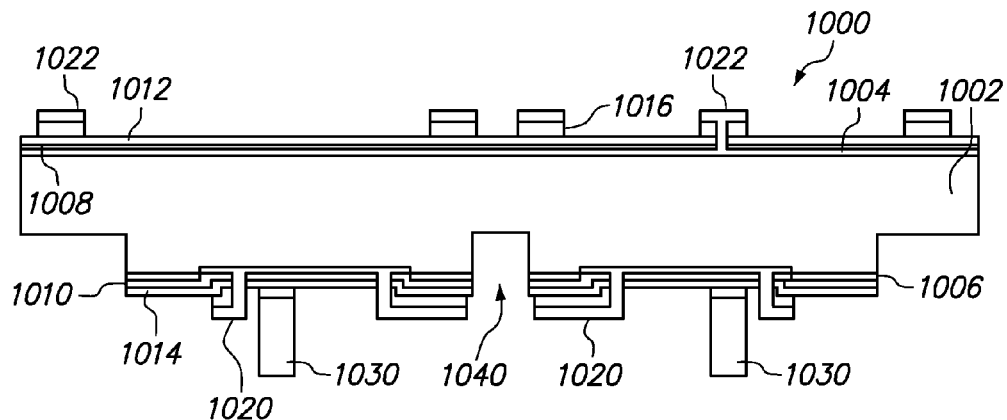
Figure 16H:
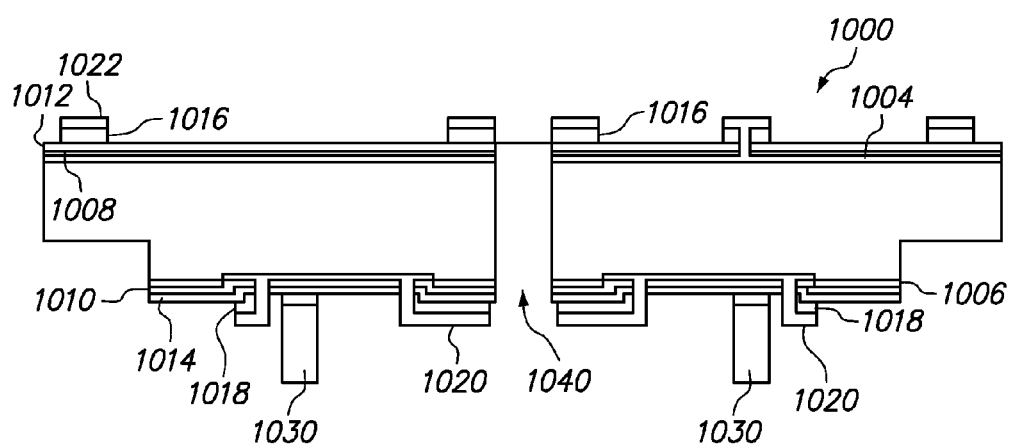
Figure 17A:
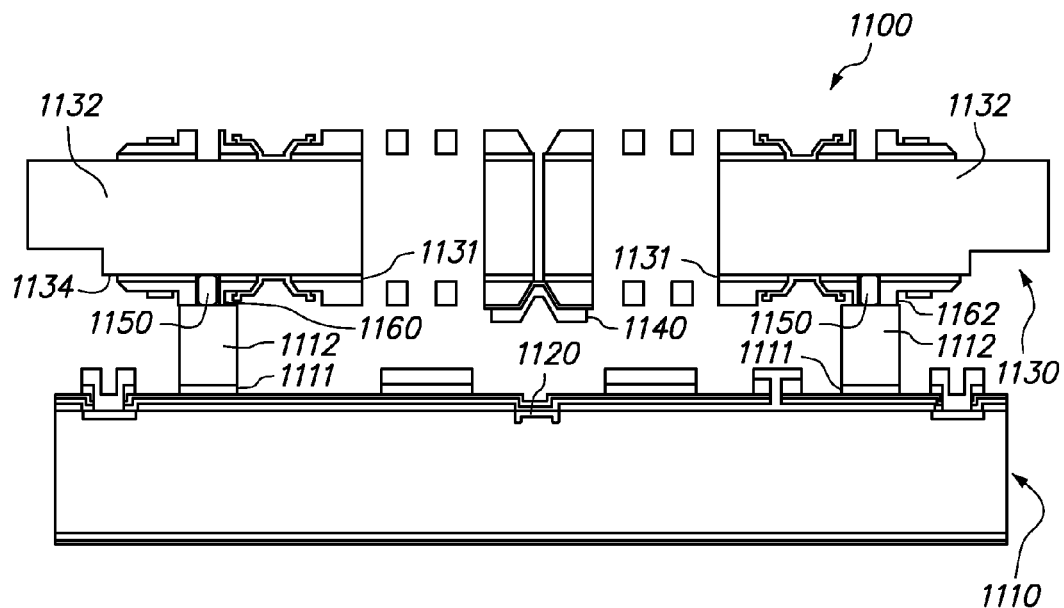
FIGS. 17A-17E show cross-sectional views of specific steps of an embodiment of the fabrication process for bonding a wafer having an optical device therein to a substrate having an optical device therein, in accordance with an embodiment of a method for fabricating a dual-suspension system for MEMS-based devices.

FIG. 16F shows the result of a process for depositing spacers on cap wafer 1000. First, oxide spacers 1030, which are of thickness to define the subsequent gap between metal electrodes 1020 and silicon proof mass 902, may be deposited on layer 1018. Then, lithography of oxide layer 1030 may occur, followed by a partial dry and wet etch of layer 1030. FIG. 16G shows the result of a process for etching a cavity 1040 in cap wafer 1000. Cavity 1040 may be used to allow light to flow down through cap wafer 1000 to optical devices that may be located within the substrate below, such as, for example, optical device 918 of substrate 900. First, lithography may be performed on backside of wafer 1000. Then, a dry etch of layers 1014 and 1010 and the thermal oxide layer 1006 may occur. Next, a DRIE of approximately half the handle wafer 1002 thickness may occur, partially defining cavity 1040. FIG. 16H shows the result of a process for completing the definition of the shape of cavity 1040, via etching from the other side of cap wafer 1000. First, lithography may be performed on the front side of wafer 1000. Then, a dry etch of layers 1012 and 1008 and the thermal oxide layer 1004 may occur. Next, a DRIE of about half the handle wafer 1002 thickness may occur Referring now to FIGS. 17A-17E, there are shown cross-sectional views of specific processes of embodiments of the fabrication process for bonding a wafer 1110 having an optical device 1120 therein to a substrate 1130 having an optical device therein 1140. The resulting device 1100 may be included within one embodiment of a MEMS-based device having a dual-suspension system fabricated from an embodiment of a method for fabricating a dual-suspension system for MEMS-based devices. FIG. 17A shows one embodiment for bonding wafer 1110 to substrate 1130. This may be accomplished by using glass frit bonding or low-temperature oxide-to-silicon bonding or other techniques such as eutectic or compression bonding. First, glass frit 1150 may be silk-screened to trenches (not shown) within the bottom surface 1134 of substrate 1130. Then, oxide spacers 1112, coupled to wafer 1110, may be aligned with the trenches. Next, wafer 1110 and substrate 1130 may be pressed together and bonded to create bonding regions 1160 and 1162 between wafer 1110 and substrate 1130. One or many bonding regions may exist between substrate 1120 and wafer 1110.

Figure 17B:
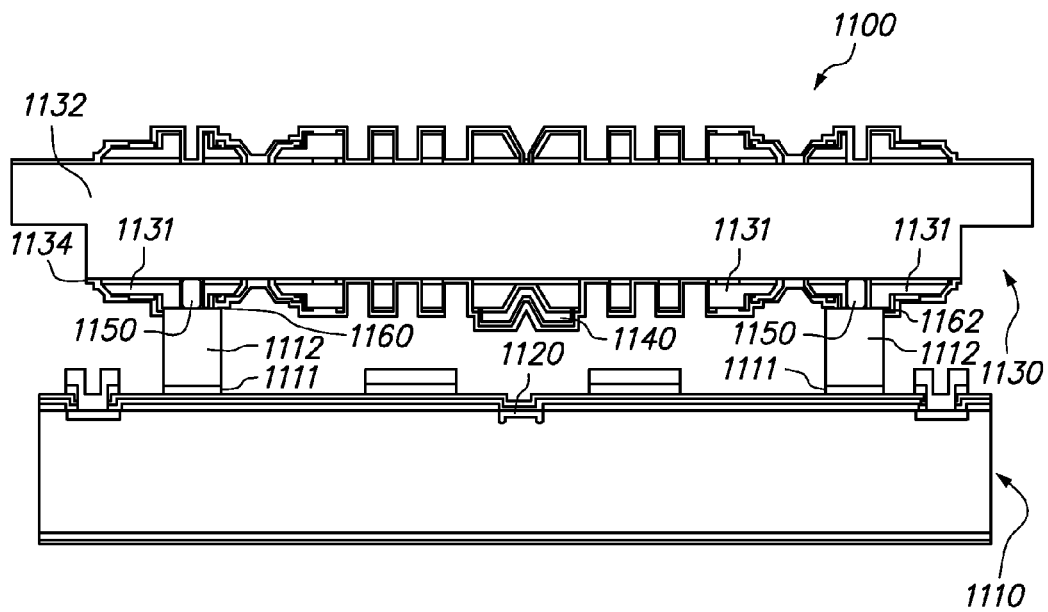
Figure 17C:
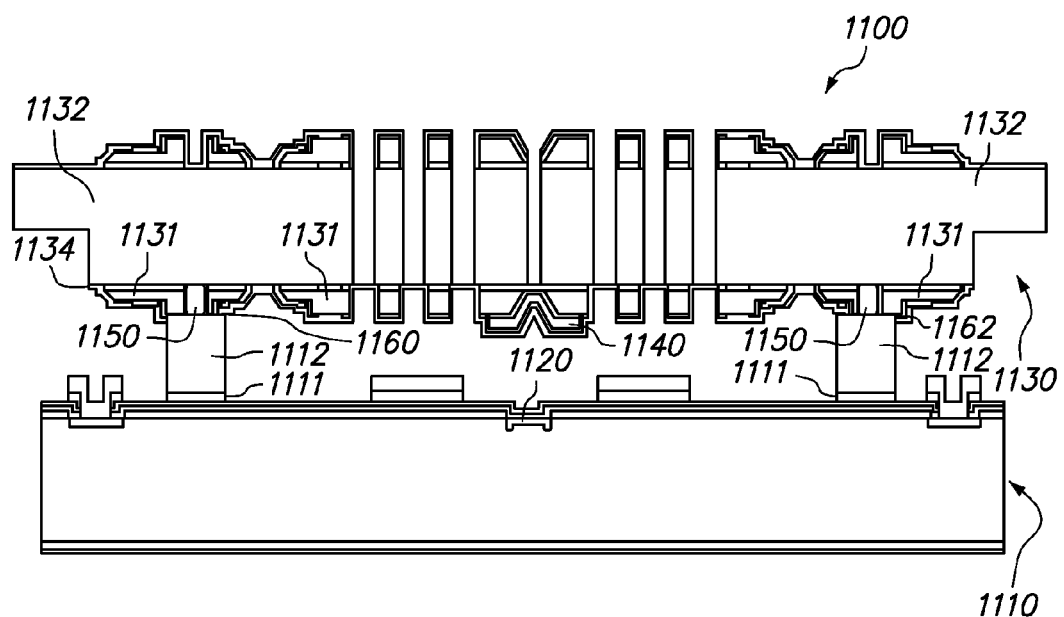
Figure 17D:
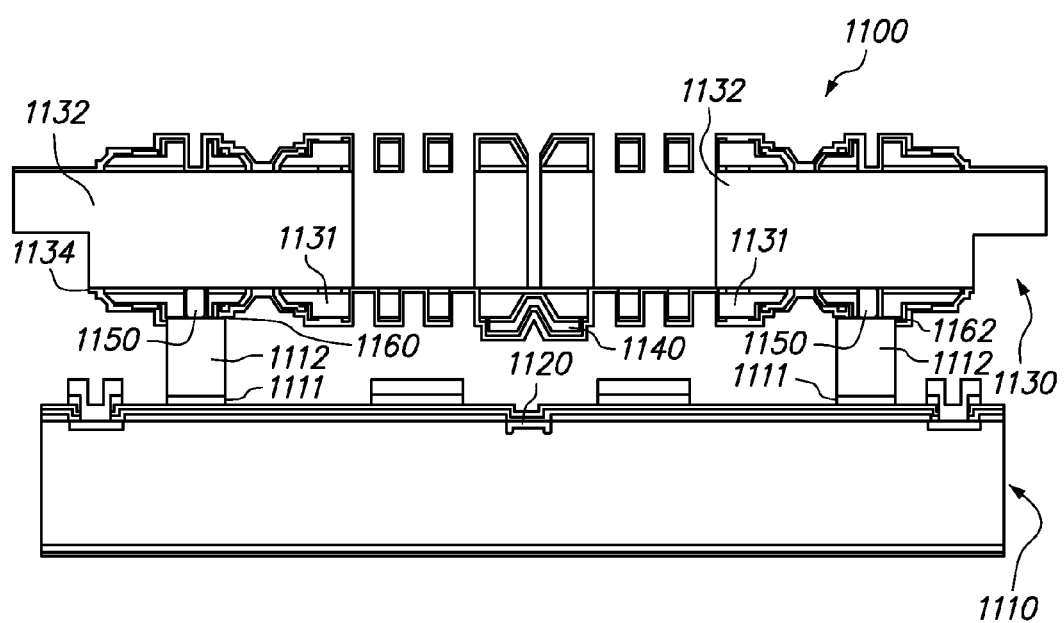
Figure 17E:
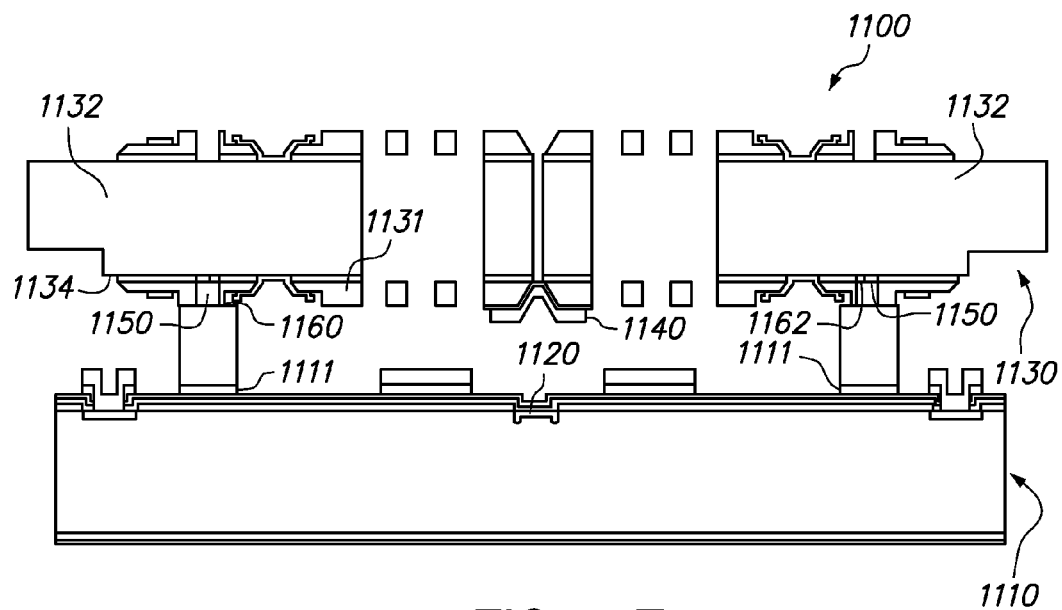

FIGS. 17B-17E show another embodiment for bonding wafer 1110 to substrate 1130. FIG. 17B shows the result of glass frit 1150 being silk-screened to trenches 1132 within the bottom surface 1134 of substrate 1130. Then, oxide spacers 1112, coupled to wafer 1110, may be aligned with trenches 1132. Next, wafer 1110 and substrate 1130 may be pressed together and bonded to create bonding regions 1160 and 1162 between wafer 1110 and substrate 1130. FIG. 17C shows the result of lithography being performed on the top surface of 1130. This process is an alternative to the process depicted in FIG. 15 O-R where substrate 1130 is first bonded to wafer 1110 and then mechanical release of the structure is performed. This is desirable for cases where due to geometries or fragility issues wafer 1130 can not be handled easily without the assistance of a more rigid handle wafer such as 1110. The steps required for FIG. 17B-E are the same as those described for FIG. 15 O-R.

Figure 18:
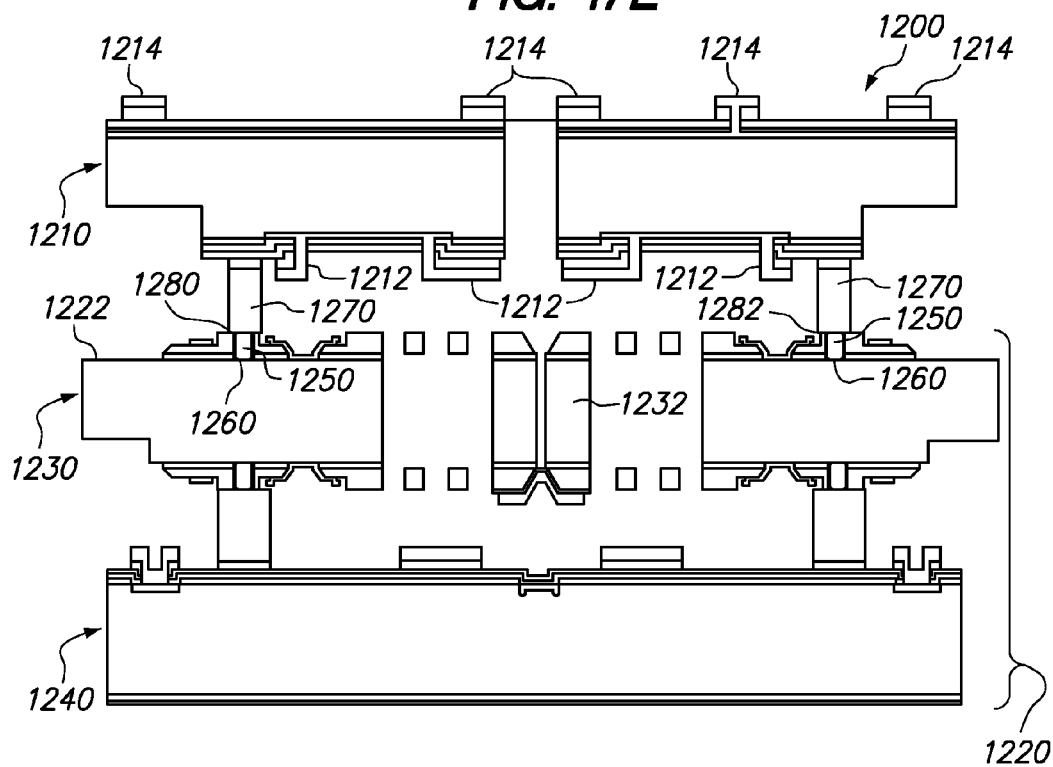
FIG. 18 shows a cross-sectional view of one embodiment of a MEMS-based device having a dual-suspension system fabricated from an embodiment of a method for fabricating a dual-suspension system for MEMS-based devices, illustrating the bonding of a cap wafer to a substrate having a lower wafer bonded thereto.

FIG. 18 show a cross-sectional view of the result of specific processes of an embodiment of the fabrication process for bonding a cap wafer 1210 to a device 1220 having a substrate 1230 and a lower wafer 1240, to create a device 1200. Device 1220 may be similar to device 1100 as shown in FIG. 17A. The resulting device 1200 may be included within one embodiment of a MEMS-based device having a dual-suspension system fabricated from an embodiment of a method for fabricating a dual-suspension system for MEMS-based devices. The bonding of cap wafer 1210 to device 1220 may be accomplished by using glass frit bonding. First, glass frit 1250 may be silk-screened to trenches 1260 within the top surface 1222 of device 1220. Then, oxide spacers 1260, coupled to cap wafer 1210, may be aligned with trenches 1260. Next, cap wafer 1210 and device 1220 may be pressed together and bonded to create bonding regions 1280 and 1282 between cap wafer 1210 and device 1220. Cap wafer 1210 may have one or more electrodes 1212 on the surface of cap wafer 1210 adjacent to substrate 1230 to control the position of proof mass 1232 of substrate 1230. Electrodes 1212 may be located substantially above proof mass 1232. Cap wafer 1210 may also have one or more electrodes 1214 on the other surface of cap wafer 1210 to allow for wire bonding of device 1200 to a package.

The scope of the claims is not limited to the embodiments disclosed herein, but extends to other embodiments as may be contemplated by those with ordinary skill in the art.

I claim:

1. A method for fabricating a dual-suspension system for MEMS-based devices comprising the steps of:
   etching the geometry of an upper spring system, a lower spring system, and a proof mass into a substrate, the substrate initially comprising:
      a handle wafer having a first side and a second side,
      a first layer of oxide covering the first side and a second layer of oxide covering the second side, and
      a first layer of silicon covering the first layer of oxide and a second layer of silicon covering the second layer of oxide, wherein the geometry of the upper spring system, the lower spring system, and the proof mass are etched into each of the first layer of silicon and the second layer of silicon, the regions of the substrate opposite the proof mass and adjacent to the upper spring system and the lower spring system defining a support structure;

applying a protective barrier to cover at least the exposed portions of the first layer of silicon;

etching through portions of the protective barrier and the handle wafer to define the shapes of the upper spring system, the lower spring system, and the proof mass;

removing the remainder of the protective barrier; and removing the first layer of oxide from the areas in contact with the upper spring system and removing the second layer of oxide from the areas in contact with the lower spring system.

2. The method for fabricating a dual-suspension system for MEMS-based devices of claim 1, wherein the etching may be performed by dry etching techniques.

3. The method for fabricating a dual-suspension system for MEMS-based devices of claim 1, wherein the handle wafer is substantially comprised of crystalline silicon.

4. The method for fabricating a dual-suspension system for MEMS-based devices of claim 1, further comprising the step of bonding a wafer to the support structure on at least one side of the substrate.

5. The method for fabricating a dual-suspension system for MEMS-based devices of claim 4, wherein the step of bonding a wafer to the support structure on at least one side of the substrate comprises the steps of:

applying a bonding layer of oxide to at least one portion of one side of the wafer;

creating a trench in at least one portion of the second layer of silicon on the support structure;

filling at least a portion of the trenches with an adhesive material;

aligning the trenches to the portions of the wafer having a bonding layer of oxide; and pressing the wafer to the substrate, wherein at least one bonding region is formed from the contacting of the trenches with the portions of the wafer having a bonding layer of oxide.

6. The method for fabricating a dual-suspension system for MEMS-based devices of claim 4 further comprising the steps of:

creating a first optical device on the surface of the substrate adjacent to the wafer;

creating a second optical device on the surface of the wafer adjacent to the substrate; and aligning the first optical device with the second optical device such that light passing through the first optical device may contact the second optical device.

7. The method for fabricating a dual-suspension system for MEMS-based devices of claim 6, wherein the first optical device is a mirror and the second optical device is a photo detector.

8. The method for fabricating a dual-suspension system for MEMS-based devices of claim 6 further comprising the step of bonding a cap wafer to the support structure of the other side of the substrate.

9. The method for fabricating a dual-suspension system for MEMS-based devices of claim 8, wherein the cap wafer includes an optical light source coupled thereto, wherein the optical light source is aligned with the first optical device such that light may pass from the optical light source through the first optical device to the second optical device.

10. The method for fabricating a dual-suspension system for MEMS-based devices of claim 9, wherein the cap wafer is comprised of an optically transparent material such that light may pass from the optical light source through the cap wafer and through the first optical device to the second optical device.

11. The method for fabricating a dual-suspension system for MEMS-based devices of claim 9, wherein the cap wafer contains a cavity therethrough, wherein light may pass from the optical light source through the cavity and through the first optical device to the second optical device.

12. The method for fabricating a dual-suspension system for MEMS-based devices of claim 9, wherein the optical light source is a semi-conducting laser.

13. The method for fabricating a dual-suspension system for MEMS-based devices of claim 1, further comprising the step of creating one or more electrical contacts on at least one surface of the substrate.

14. The method for fabricating a dual-suspension system for MEMS-based devices of claim 13, wherein the step of creating one or more electrical contacts on at least one surface of the substrate comprises the steps of:

creating a first electrical contact by etching through the first layer of silicon and the first layer of oxide, depositing a layer of polysilicon over at least a portion of the region of the handle wafer exposed by the etching, the layer of polysilicon overlapping a portion of the first layer of silicon, and metallizing the polysilicon to allow for wire bonding to a package; and creating a second electrical contact by etching through the second layer of silicon and the second layer of oxide, depositing a layer of polysilicon over at least a portion of the region of the handle wafer exposed by the etching, the layer of polysilicon overlapping a portion of the first layer of silicon, and metallizing the polysilicon to allow for wire bonding to a package, wherein the first electrical contact, the second electrical contact, and the handle wafer allow for electrical potential to be applied to the substrate.

15. The method for fabricating a dual-suspension system for MEMS-based devices of claim 1, wherein the protective barrier is comprised of a deposited oxide.

16. The method for fabricating a dual-suspension system for MEMS-based devices of claim 1, wherein the step of etching through portions of the protective barrier and the handle wafer to define the shapes of the upper spring system, the lower spring system, and the proof mass comprises the steps of:

etching through the areas between the upper spring system and proof mass;

etching through the areas between each spring of the upper spring system; and etching through the areas between the upper spring system and the support structure.

17. The method for fabricating a dual-suspension system for MEMS-based devices of claim 16, wherein the step of etching through portions of the protective barrier and the handle wafer to define the shapes of the upper spring system, the lower spring system, and the proof mass further comprises the step of etching through the areas beneath each spring of the upper spring system and above each spring of the lower spring system.

18. The method for fabricating a dual-suspension system for MEMS-based devices of claim 1, wherein the steps of removing the remainder of the protective barrier and removing the first layer of oxide from the areas in contact with the upper spring system and removing the second layer of oxide from the areas in contact with the lower spring system are performed by use of a wet oxide etchant.

19. The method for fabricating a dual-suspension system for MEMS-based devices of claim 1, wherein the first layer of silicon and the second layer of silicon are comprised of crystalline silicon.

20. A method for fabricating a dual-suspension system for MEMS-based devices comprising the steps of:
  etching the geometry of an upper spring system, a lower spring system, and a proof mass into a substrate, the substrate initially comprising:
    a handle wafer having a first side and a second side,
    a first layer of oxide covering the first side and a second layer of oxide covering the second side, and
    a first layer of silicon covering the first layer of oxide and a second layer of silicon covering the second layer of oxide, wherein the geometry of the upper spring system, the lower spring system, and the proof mass are etched into each of the first layer of silicon and the second layer of silicon, the regions of the substrate opposite the proof mass and adjacent to the upper spring system and the lower spring system defining a support structure;
  applying a protective barrier to cover at least the exposed portions of the first layer of silicon;
  bonding a wafer to the support structure on at least one side of the substrate;
  etching through portions of the protective barrier and the handle wafer to define the shapes of the upper spring system, the lower spring system, and the proof mass;
  removing the remainder of the protective barrier;
  removing the first layer of oxide from the areas in contact with the upper spring system and removing the second layer of oxide from the areas in contact with the lower spring system; and
  creating one or more electrical contacts on at least one surface of the substrate.

21. The method for fabricating a dual-suspension system for MEMS-based devices of claim 20, wherein the step of bonding a wafer to the support structure on at least one side of the substrate comprises the steps of:
  applying a bonding layer of oxide to at least one portion of one side of the wafer;
  creating a trench in at least one portion of the second layer of oxide of the support structure;
  filling at least a portion of the trench with an adhesive material;
  aligning the portions of the wafer having the bonding layer of oxide to the trenches; and
  pressing the wafer to the substrate, wherein at least one bonding region is formed from the contacting of the trenches with the portions of the wafer having the bonding layer of oxide.

22. The method for fabricating a dual-suspension system for MEMS-based devices of claim 21, wherein the adhesive material is glass frit.

23. The method for fabricating a dual-suspension system for MEMS-based devices of claim 20, wherein the step of bonding a wafer to the support structure on at least one side of the substrate is performed by fusion bonding.

24. The method for fabricating a dual-suspension system for MEMS-based devices of claim 20 further comprising the step of bonding a cap wafer to the support structure on the other side of the substrate.

25. The method for fabricating a dual-suspension system for MEMS-based devices of claim 24 further comprising the steps of:
  creating a first optical device on the surface of the substrate adjacent to the wafer;
  creating a second optical device on the surface of the wafer adjacent to the substrate; and
  aligning the first optical device with the second optical device such that light passing through the first optical device may contact the second optical device.

26. The method for fabricating a dual-suspension system for MEMS-based devices of claim 25, wherein the first optical device is a mirror and the second optical device is a mirror.

27. The method for fabricating a dual-suspension system for MEMS-based devices of claim 25, wherein the cap wafer includes an optical light source, wherein the optical light source is aligned with the first optical device such that light may pass from the optical light source through the first optical device to the second optical device.

28. The method for fabricating a dual-suspension system for MEMS-based devices of claim 20, wherein the step of creating one or more electrical contacts on at least one surface of the substrate comprises the steps of:
  creating a first electrical contact by etching through the first layer of silicon and the first layer of oxide and depositing a layer of metal over at least a portion of the region of the handle wafer exposed by the etching; and
  creating a second electrical contact by etching through the second layer of silicon and the second layer of oxide and depositing a layer of metal over at least a portion of the region of the handle wafer exposed by the etching, wherein the first electrical contact, the second electrical contact, and the handle wafer allow for electrical potential to be applied to the substrate.

29. A method for fabricating a dual-suspension system for MEMS-based devices comprising the steps of:
  etching the geometry of an upper spring system, a lower spring system, and a proof mass into a substrate, the substrate initially comprising:
    a handle wafer having a first side and a second side,
    a first layer of oxide covering the first side and a second layer of oxide covering the second side, and
    a first layer of silicon covering the first layer of oxide and a second layer of silicon covering the second layer of oxide, wherein the geometry of the upper spring system, the lower spring system, and the proof mass are etched into each of the first layer of silicon and the second layer of silicon, the regions of the substrate opposite the proof mass and adjacent to the upper spring system and the lower spring system defining a support structure;
  applying a protective barrier to cover at least the exposed portions of the first layer of silicon;
  bonding a wafer to the support structure on at least one side of the substrate by the steps of:
    applying a bonding layer of oxide to at least one portion of one side of the wafer;
    creating a trench in at least one portion of the second layer of silicon on the support structure;
    filling at least a portion of the trench with an adhesive material,
    aligning the portions of the wafer having the bonding layer of oxide to the trenches, and
    pressing the wafer to the substrate, wherein at least one bonding region is formed from the contacting of the trenches with the portions of the wafer having the bonding layer of oxide;
  etching through portions of the protective barrier and the handle wafer to define the shapes of the upper spring system, the lower spring system, and the proof mass;

removing the remainder of the protective barrier;

removing the first layer of oxide from the areas in contact with the upper spring system and removing the second layer of oxide from the areas in contact with the lower spring system; and creating one or more electrical contacts on at least one surface of the substrate.

30. The method for fabricating a dual-suspension system for MEMS-based devices of claim 29, wherein the step of creating one or more electrical contacts on at least one surface of the substrate comprises the steps of:

creating a first electrical contact by etching through the first layer of silicon and the first layer of oxide, depositing a layer of polysilicon over at least a portion of the region of the handle wafer exposed by the etching, the layer of polysilicon overlapping a portion of the first layer of silicon, and metallizing the polysilicon to allow for wire bonding to a package; and creating a second electrical contact by etching through the second layer of silicon and the second layer of oxide, depositing a layer of polysilicon over at least a portion of the region of the handle wafer exposed by the etching, the layer of polysilicon overlapping a portion of the first layer of silicon, and metallizing the polysilicon to allow for wire bonding to a package, wherein the first electrical contact, the second electrical contact, and the handle wafer allow for electrical potential to be applied to the substrate.

31. The method for fabricating a dual-suspension system for MEMS-based devices of claim 29 further comprising the steps of:

creating a first optical device within the substrate;

creating a second optical device within the surface of the wafer adjacent to the substrate; and aligning the first optical device with the second optical device such that light passing through the first optical device may contact the second optical device.

32. The method for fabricating a dual-suspension system for MEMS-based devices of claim 31 further comprising the step of bonding a cap wafer to the support structure of the other side of the substrate, the cap wafer having an optical light source coupled thereto, wherein the optical light source is aligned with the first optical device such that light may pass from the optical light source through the first optical device to the second optical device.

* * * * *